(12) United States Patent
Yamamoto et al.

(10) Patent No.: US 6,593,229 B1
(45) Date of Patent: Jul. 15, 2003

(54) SEMICONDUCTOR INTEGRATED CIRCUIT DEVICE AND METHOD FOR MANUFACTURING THE SAME

(75) Inventors: Naoki Yamamoto, Saitama (JP); Yoshikazu Tanabe, Saitama (JP)

(73) Assignee: Hitachi, Ltd., Tokyo (JP)

( * ) Notice: Subject to any disclaimer, the term of this patent is extended or adjusted under 35 U.S.C. 154(b) by 152 days.

(21) Appl. No.: 09/635,270

(22) Filed: Aug. 9, 2000

Related U.S. Application Data

(63) Continuation of application No. 09/577,671, filed on May 25, 2000.

(30) Foreign Application Priority Data

Jun. 4, 1999  (JP) .......................................... 11-158089

(51) Int. Cl.⁷ .................. H01L 21/338; H01L 21/8234; H01L 21/3205; H01L 21/4763
(52) U.S. Cl. ...................... 438/635; 438/167; 438/197; 438/585; 438/592; 438/785; 438/768
(58) Field of Search ................. 438/167, 197, 438/635, 585, 592, 785, 768

(56) References Cited

U.S. PATENT DOCUMENTS

| | | | | |
|---|---|---|---|---|
| 4,505,028 A | * | 3/1985 | Kobayashi et al. ......... | 438/301 |
| 6,066,508 A | * | 5/2000 | Tanabe et al. ................ | 438/38 |
| 6,162,741 A | * | 12/2000 | Akasaka et al. ............. | 438/773 |
| 6,214,683 B1 | * | 4/2001 | Xiang et al. ................ | 438/305 |
| 6,228,752 B1 | * | 5/2001 | Miyano ....................... | 438/592 |
| 6,239,044 B1 | * | 5/2001 | Kashiwagi et al. ......... | 438/787 |
| 6,303,494 B1 | * | 10/2001 | Yeo et al. ................... | 438/653 |
| 6,326,670 B1 | * | 12/2001 | Nishiyama et al. ......... | 257/411 |
| 6,362,086 B2 | * | 3/2002 | Weimer et al. ............. | 438/591 |
| 6,383,873 B1 | * | 5/2002 | Hedge et al. ............... | 438/287 |
| 2001/0051406 A1 | * | 12/2001 | Weimer et al. ............. | 438/240 |

FOREIGN PATENT DOCUMENTS

| | | |
|---|---|---|
| JP | 59-132136 | 7/1984 |
| JP | 60160667 | 8/1985 |
| JP | 7-94716 | 4/1995 |

OTHER PUBLICATIONS

Nakajima et al., "Poly–metal Gate Process—Ultrathin WsiN Barrier Layer Impermeable to Oxidant In–diffusion during Si Selective Oxidation", ULSI Research Labs, Toshiba Corp, 1995.

* cited by examiner

*Primary Examiner*—Caridad Everhart
*Assistant Examiner*—Chuong Luu
(74) *Attorney, Agent, or Firm*—Antonelli, Terry, Stout, & Kraus, LLP

(57) ABSTRACT

Described is a manufacturing method for a semiconductor integrated circuit device which comprises forming, over a gate insulating film which has been formed over the main surface of a single crystal silicon substrate to have an effective film thickness less than 5 nm in terms of $SiO_2$, a W film as a gate electrode material, and heat treating the silicon substrate in a water-vapor- and hydrogen-containing gas atmosphere having a water vapor/hydrogen partial pressure ratio set at a ratio permitting oxidation of silicon without substantial oxidation of the W film, whereby defects of the gate insulating film rightly under the W film are repaired. According to the present invention, in a MISFET having a metal gate electrode formed over a ultra-thin gate insulating film having an effective film thickness less than 5 nm in terms of $SiO_2$, defects of the gate insulating film can be repaired without oxidizing the metal gate electrode.

7 Claims, 27 Drawing Sheets

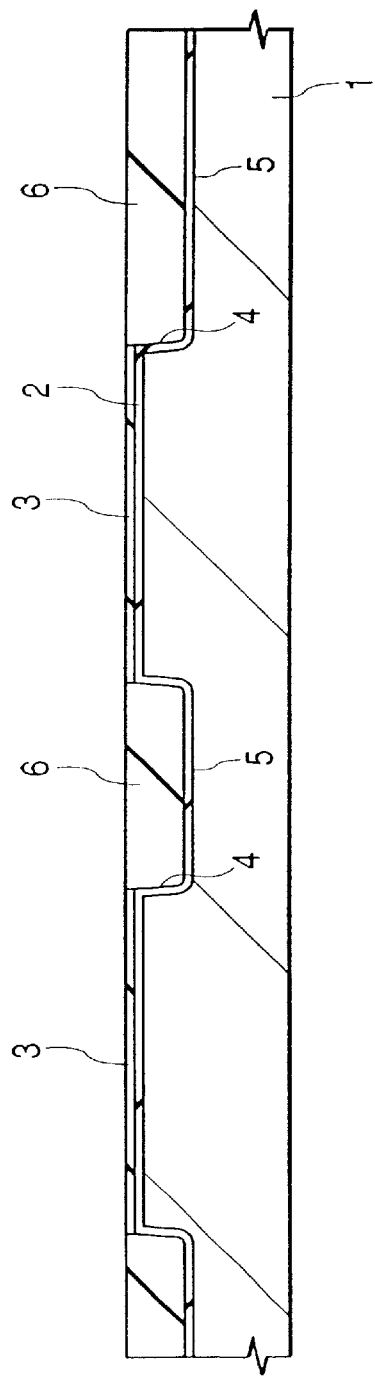
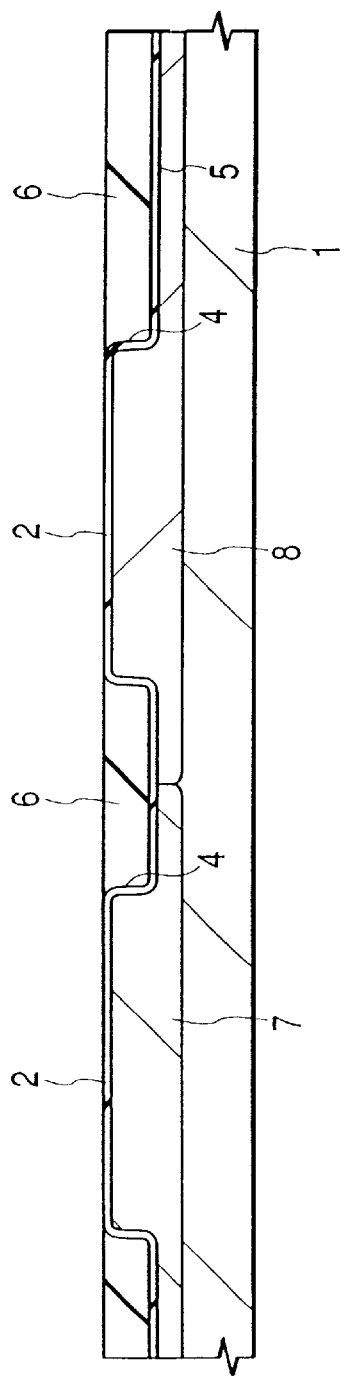

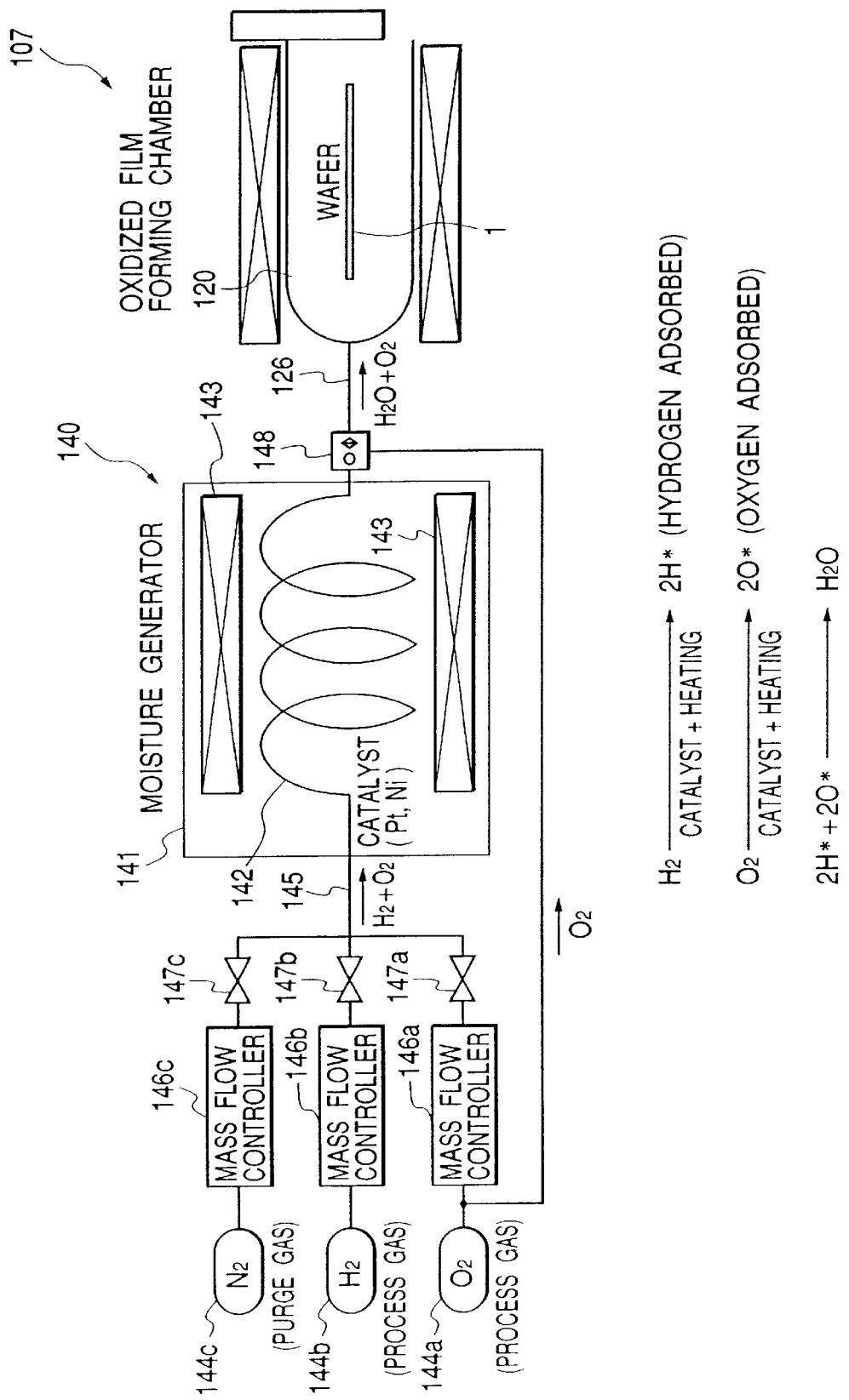

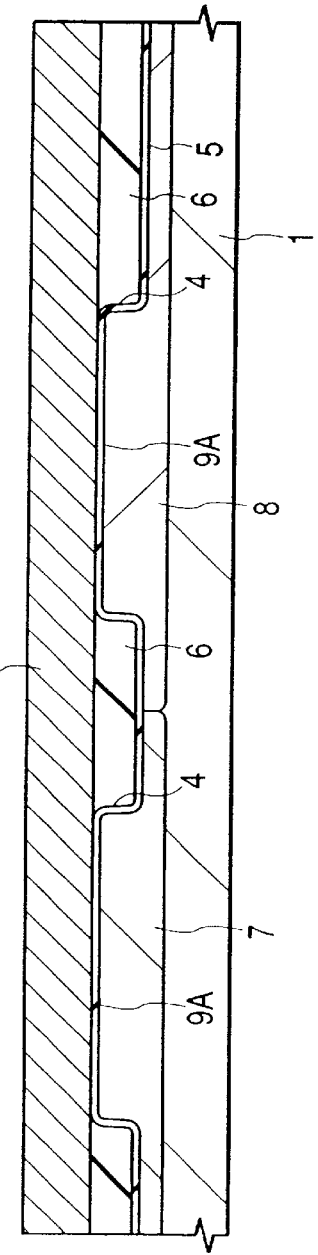

(a) $W + 3H_2O \rightleftarrows WO_3 + 3H_2$
(b) $Mo + 2H_2O \rightleftarrows MoO_2 + 2H_2$
(c) $2Ta + 5H_2O \rightleftarrows Ta_2O_5 + 5H_2$
(d) $Si + 2H_2O \rightleftarrows SiO_2 + 2H_2$
(e) $Ti + 2H_2O \rightleftarrows TiO_2 + 2H_2$ $d_r$ = EFFECTIVE FILM THICKNESS IN $SiO_2$ TERMS $d_i$ = THICKNESS OF TARGET INSULATING FILM $\varepsilon_s$ = DIELECTRIC CONSTANT OF SILICON $\varepsilon_i$ = DIELECTRIC CONSTANT OF TARGET INSULATING FILM $$d_r = \varepsilon_s \sum_i \frac{d_i}{\varepsilon_i}$$

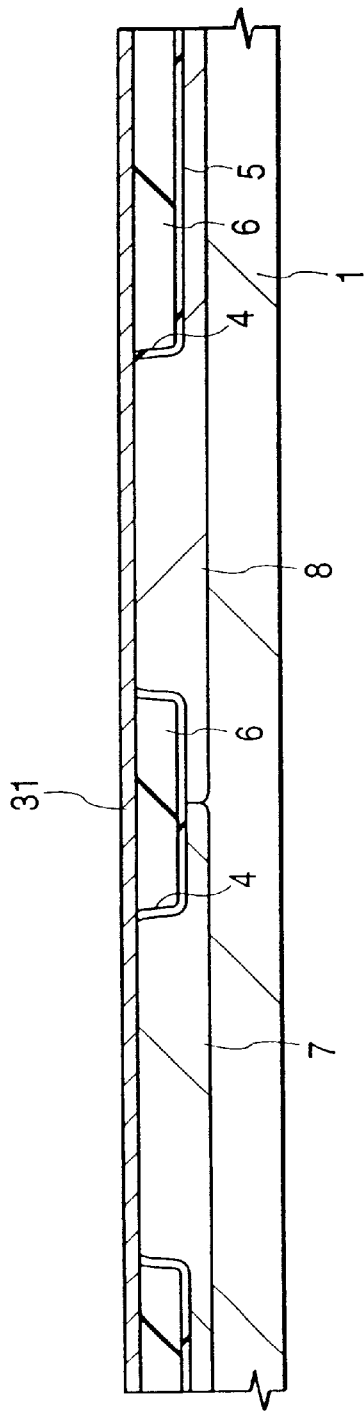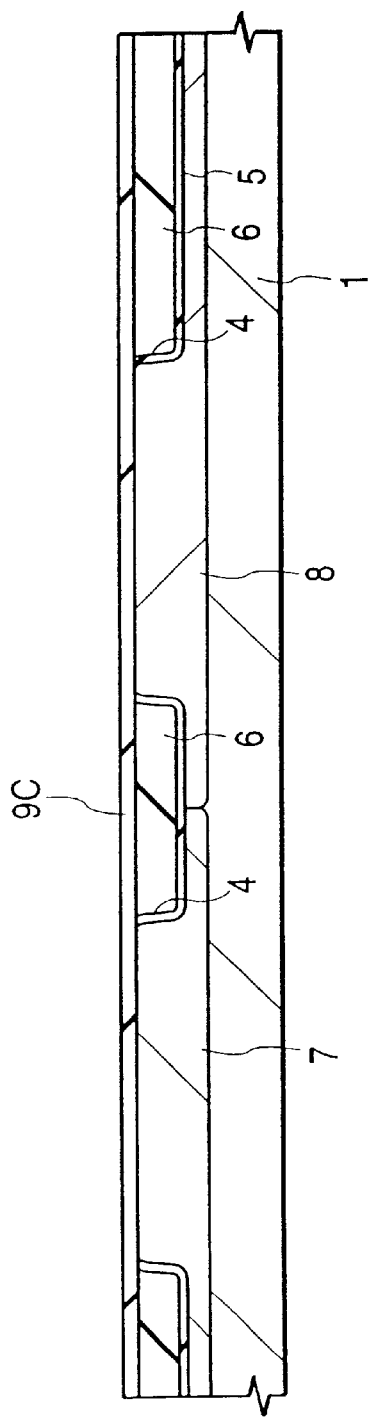

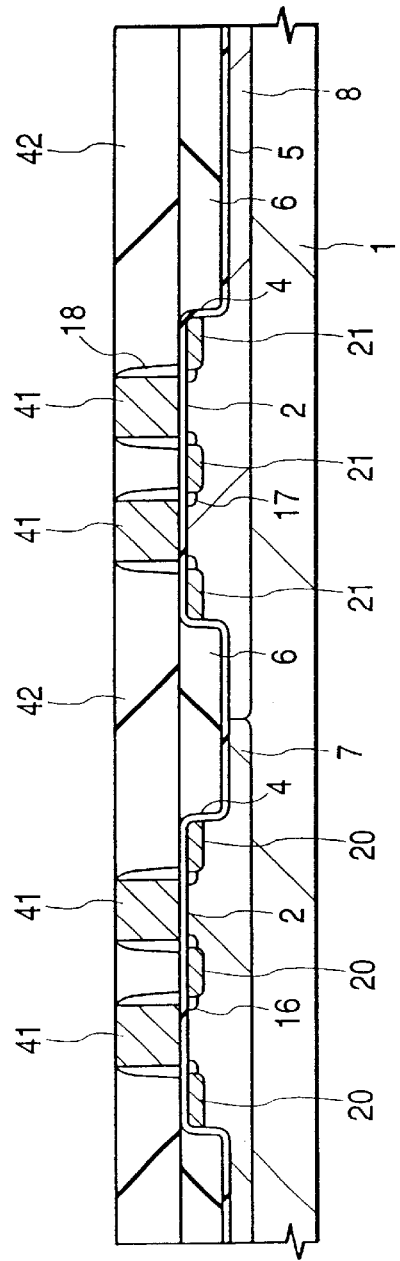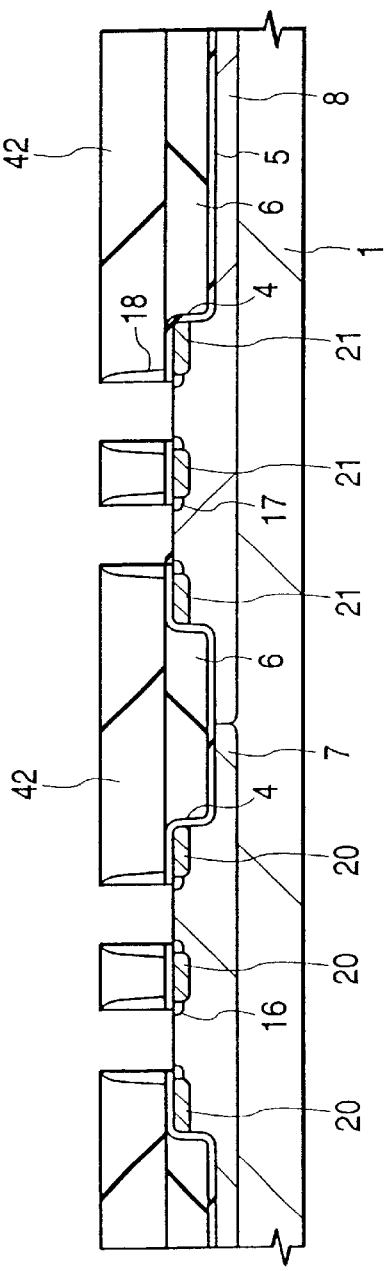

SEMICONDUCTOR INTEGRATED CIRCUIT DEVICE AND METHOD FOR MANUFACTURING THE SAME

CROSS-REFERENCE TO RELATED APPLICATION

This application is a continuation of application Ser. No. 09/577,671, filed on May 25, 2000, the entire disclosure of which is hereby incorporated by reference.

BACKGROUND OF THE INVENTION

This invention relates to a manufacturing technique of a semiconductor integrated circuit device, particularly to a technique effective when adapted to the manufacture of a semiconductor integrated circuit device having a MISFET equipped with a metal gate electrode.

Japanese Patent Application Laid-Open No. SHO 59(1984)-132136 (Kobayashi, et al., corresponding to U.S. Pat. No. 4,505,028) discloses a technique wherein a gate electrode of a metal structure, is formed from a W film (or Mo film) on a Si (silicon) substrate and then, the resulting electrode is oxidized in a mixed atmosphere of water vapor and hydrogen, whereby only Si is selectively oxidized without oxidizing the W (Mo) film. This technique makes use of the fact that a water vapor/hydrogen partial pressure ratio at which the redox reaction is in equilibrium is different between W (Mo) and Si. Selective oxidation of Si is actualized by setting this partial pressure ratio within a range permitting the reduction of W (Mo) but oxidation of Si.

Japanese Patent Application Laid-Open No. HEI 7(1995)-94716 (Muraoka, et al.) discloses a technique wherein a gate electrode of a polymetal structure including a metal nitride layer such as TiN and a metal layer such as W is formed over an Si substrate via a gate oxidized film and then, the resulting substrate is oxidized in a reducing gas (hydrogen)+ oxidizing gas (vapor vapor) atmosphere diluted with nitrogen. According to it, only Si can be selectively oxidized without oxidation of the metal layer and at the same time, oxidation of the metal nitride layer can be prevented, because denitrification from the metal nitride layer can be prevented by diluting the water vapor+hydrogen gas mixture with nitrogen.

Japanese Patent Application Laid-Open No. SHO 60(1985)-160667 (Agatsuma) discloses a technique wherein a thin film made of a refractory metal such as W or Mo is formed over a silicon substrate and then, the resulting substrate is heat treated in a non-oxidizing atmosphere to diffuse oxygen occluded in the thin film to the surface of the substrate, whereby an extremely thin silicon oxide film is formed on the interface between them.

SUMMARY OF THE INVENTION (1) A CMOS-LSI having a circuit formed from a MISFET having a gate length as minute as 0.18 $\mu$m or less is required to have a gate electrode formed using a metal-containing low-resistance conductive material in order to lower gate delay even upon operation at low voltage, thereby maintaining high-speed operation.

A composite conductive film (which will hereinafter be called "polymetal") having a refractory metal film stacked over a polycrystalline silicon film has been regarded promising as such a low-resistance gate electrode material. The polymetal can be used not only as a gate electrode material but also as an interconnection material, because it has a sheet resistance as low as about 2 $\Omega/\square$. As the refractory metal, W (tungsten), Mo (molybdenum), Ti (titanium) or the like which exhibits good low resistance even in a low temperature process of 800° C. or less and at the same time, has high electromigration resistance can be employed. Direct stacking of such a refractory metal film on a polycrystalline silicon film, however, causes inconveniences such as lowering in their adhesive forces and formation of a high-resistance silicide layer on the interface between them upon high-temperature heat treatment process. Accordingly, an industrially used polymetal gate is constituted of three layers having, between a polycrystalline silicon film and a refractory metal film, a conductive barrier film made of a metal nitride film such as TiN (titanium nitride) or WN (tungsten nitride).

(2) With a view to setting the threshold voltage (Vth) of a CMOS-LSI having a circuit formed from a MISFET having a gate length as minute as 0.18 $\mu$m or less at a low level for satisfying a tendency to low-voltage operation, a so-called dual gate structure wherein a polycrystalline silicon film partially constituting a polymetal gate has a n-type conductivity for the n-channel type MISFET and p-type conductivity for the p-channel type MISFET tends to be adopted. In this structure, the gate electrode of the n-channel type MISFET has a refractory metal film stacked on the n-type polycrystalline silicon film doped with n type impurities such as P (phosphorus), while that of the p-channel type MISFET has a refractory metal film stacked on the p-type polycrystalline film doped with p type impurities such as B (boron).

The CMOS-LSI as described above in (1) is however accompanied with the problem that when the gate length of the MISFET becomes not greater than 0.18 $\mu$m, a two-layer structure having a refractory metal film stacked on a polycrystalline silicon film or a three-layer structure having a conductive barrier film formed therebetween inevitably has a markedly increased aspect ratio, which makes processing of the gate electrode difficult.

The CMOS-LSI as described above in (2) is on the other hand accompanied with the problem that B (boron) in the p-type polycrystalline silicon film partially constituting the gate electrode of the p-channel type MISFET is diffused through the gate oxide film to the side of the substrate and changes the flat band voltage (Vfb) of the p-channel type MISFET, thereby causing a fluctuation in the threshold voltage (Vth).

A so-called metal gate electrode having a refractory metal film such as W or Mo directly formed on a gate oxide film without disposing therebetween an intermediate layer such as polycrystalline silicon film is therefore under development for avoiding the above-described problems.

In order to actualize high velocity and high performance of a MISFET, it is necessary to reduce the film thickness of a gate oxide film in proportion to the miniaturization of the MISFET. For example, a MISFET having a gate length of about 0.25 $\mu$m to 0.2 $\mu$m needs a gate oxide film having a film thickness thinner than 5 nm.

When the film thickness of the gate oxide film is reduced to 5 nm or less, however, lowering in the withstand voltage due to generation of a direct tunnel current or hot carriers induced from a stress becomes apparent. In addition, direct formation of a refractory metal film such as W or Mo over such a thin gate oxide film causes defects in the gate oxide film in the vicinity of the interface between them, thereby reducing the withstand voltage.

Since the defects of the gate oxide film mainly result from the oxygen deficiency of an Si—O bond, it is possible to repair the defects by heat treating the substrate in an oxidizing atmosphere, thereby supplying the oxygen-deficient portion with oxygen. The heat treatment of the substrate in an oxidizing atmosphere, however, causes simultaneous oxidation of a refractory metal film which is a gate electrode material deposited over a gate oxide film and inevitably increases the resistance of a gate insulating film.

In order to prevent a reduction in the withstand voltage due to a thinning tendency of a gate oxide film, it is considered as one countermeasure to use, as a gate insulating film material, an insulating metal oxide such as tantalum oxide having a dielectric constant larger than silicon oxide, thereby increasing its effective thickness.

Such an insulating metal oxide is a crystalline material so that a step of heat treating it in an oxygen atmosphere after film formation to supply the film with oxygen is indispensable for obtaining its original insulation properties. Heat treatment of the substrate in an oxidizing atmosphere, however, increases the resistance of the gate insulating film, because a refractory metal film, which is a gate electrode material deposited over the gate insulating film, is oxidized at the same time.

An object of the present invention is therefore to provide a technique for improving the reliability and production yield of a MISFET having a metal gate electrode formed over an ultra-thin gate insulating film.

Another object of the present invention is to provide a technique for improving the reliability and production yield of a MISFET having a metal gate electrode formed over a gate insulating film containing a metal oxide having a higher dielectric constant than silicon oxide.

A further object of the present invention is to provide a process for forming a gate insulating film having a film thickness less than 5 nm in.terms of $SiO_2$.

A still further object of the present invention is to provide a process for repairing the defect of a gate insulating film having a film thickness less than 5 nm in terms of $SiO_2$.

The above-described and the other objects and novel features of the present invention will be apparent from the description herein and accompanying drawings.

Among the inventions disclosed by the present application, summaries of the typical ones will next be described briefly.

In the method for manufacturing a semiconductor integrated circuit device according to the present invention, by forming a refractory metal film, which is to be a gate electrode, over a gate insulating film formed over the main surface of a silicon substrate and having a thickness less than 5 nm in terms of $SiO_2$ and then heat treating the silicon substrate in a water vapor+hydrogen mixed gas atmosphere having a water vapor/hydrogen partial pressure ratio set at a ratio permitting oxidation of silicon without substantial oxidization of the refractory metal, defects of the gate insulating film rightly under the refractory metal film are repaired.

The summary of the inventions according to the present application other than the above-described one will next be described in items.

1. A method for manufacturing a semiconductor integrated circuit device, which comprises the following steps:
   (a) forming, over the silicon surface on the first main surface of a wafer, a gate insulating film having a film thickness less than 5 nm in terms of $SiO_2$ and made of a single insulating film containing silicon oxide as a principal component or a composite film thereof with another insulating film;
   (b) forming, on the gate insulating film, a metal film containing a refractory metal as a principal component without disposing, therebetween, an intermediate layer containing polycrystalline silicon as a principal component and then patterning the metal film to form a metal gate electrode; and
   (c) heat treating the first main surface having the metal gate electrode formed thereover in a water-vapor- and hydrogen-containing gas atmosphere having a water vapor/hydrogen partial pressure ratio set at a ratio permitting oxidation of silicon without substantial oxidation of the refractory metal, thereby repairing defects in the gate insulating film rightly under the metal gate electrode.

2. The method as described above in 1, wherein the refractory metal is molybdenum or tungsten.

3. The method as described above in 1 or 2, wherein the gate insulating film has a film thickness less than 4 nm in terms of $SiO_2$.

4. The method as described above in 1 or 2, wherein the gate insulating film has a film thickness less than 3 nm in terms of $SiO_2$.

5. A method for manufacturing a semiconductor integrated circuit device, which comprises the following steps:
   (a) forming, over the silicon surface on the first main surface of a wafer, a gate insulating film having a film thickness less than 5 nm in terms of $SiO_2$ and made of a single insulating film containing silicon nitride as a principal component or a composite film thereof with another insulating film;
   (b) forming, over the gate insulating film, a metal film containing a refractory metal as a principal component without disposing, therebetween, an intermediate layer containing polycrystalline silicon as a principal component and then patterning the metal film to form a metal gate electrode; and
   (c) heat treating the first main surface having the metal gate electrode formed thereover in a water-vapor- and hydrogen-containing gas atmosphere having a water vapor/hydrogen partial pressure ratio set at a ratio permitting oxidation of silicon without substantial oxidation of the refractory metal, thereby repairing defects in the gate insulating film rightly under the metal gate electrode.

6. The method as described above in 5, wherein the refractory metal is molybdenum or tungsten.

7. The method as described above in 5 or 6, wherein the water vapor+hydrogen mixed gas further contains a nitrogen or ammonia gas.

8. A process for manufacturing a semiconductor integrated circuit device, which comprises the following steps:
   (a) forming, over the silicon surface on the first main surface of a wafer, a gate insulating film having a film thickness less than 5 nm in terms of $SiO_2$ and made of a single insulating film containing as a principal component a metal oxide having a dielectric constant larger than silicon dioxide or a composite film thereof with another insulating film;
   (b) forming, thereover, a metal film having a refractory metal as a principal component without disposing, therebetween, an intermediate layer containing polycrystalline silicon as a principal component and then patterning the metal film to form a metal gate electrode; and
   (c) heat treating the first main surface having the metal gate electrode formed thereover in a water-vapor- and hydrogen-containing gas atmosphere having a water vapor/hydrogen partial pressure ratio set at a ratio permitting oxidation of silicon without substantial oxidation of the refractory metal, thereby repairing the defects in the gate insulating film rightly under the metal gate electrode.

9. The method as described above in 8, wherein the metal constituting the metal oxide film is titanium, zirconium or hafnium.

10. The method as described above in 8, wherein the metal constituting the metal oxide film is tantalum.

11. The method as described above in 8, wherein the metal constituting the metal oxide film is aluminum.

12. The method as described above in 8, wherein the metal oxide film is a high dielectric substance including a $ABO_3$ type average perovskite structure and is in a paraelectric phase at an operating temperature.

13. The method as described above in 12, wherein the high dielectric substance is BST.

14. A process for manufacturing a semiconductor integrated circuit device, which comprises the following steps:
   (a) forming, over the silicon surface on the first main surface of a wafer, a first film containing, as a principal component, a first refractory metal having a redox equilibrium curve in a water-vapor- and hydrogen-containing gas atmosphere on the lower water vapor side than that of silicon;
   (b) heat treating the first main surface having the first film formed thereover in a water-vapor- and hydrogen-containing gas atmosphere having a water vapor/hydrogen partial pressure ratio set at a ratio permitting the oxidation of the first refractory metal without substantial oxidation of the silicon surface, thereby converting the first refractory metal to the oxide thereof, whereby forming a gate insulating film over the first main surface; and
   (c) forming a gate electrode before or after the step (b).

15. The process as described above in 14, wherein the first refractory metal is titanium, zirconium or hafnium.

16. The process as described above in 14 or 15, wherein the water-vapor- and hydrogen-containing gas atmosphere in the step (b) is formed by synthesizing water vapor in the presence of a catalyst.

17. A process for manufacturing a semiconductor integrated circuit device, which comprises the following steps:
   (a) forming, over the silicon surface on the first main surface of a wafer, a gate insulating film containing, as a principal component, an oxide of a first refractory metal having a redox equilibrium curve in a water-vapor- and hydrogen-containing gas atmosphere on the lower water vapor side than that of silicon;
   (b) heat treating the first main surface having the gate insulating film formed thereover in a water-vapor- and hydrogen-containing gas atmosphere having a water vapor/hydrogen partial pressure ratio set at a ratio permitting the oxidation of the first refractory metal without substantial oxidation of the silicon surface, thereby converting the first refractory metal to the oxide thereof, whereby defects in the gate insulating film are repaired; and
   (c) forming a gate electrode over the gate insulating film before or after the step (b).

18. The process as described above in 17, wherein the gate insulating film in the step (a) is formed over the silicon surface via a silicon oxide film.

19. The process as described above in 17 or 18, wherein the first refractory metal is titanium, zirconium or hafnium.

20. The process as described above in any one of 17, 18 and 19, wherein the water-vapor- and hydrogen-containing gas atmosphere in the step (b) is formed by synthesizing water vapor in the presence of a catalyst.

21. A process for manufacturing a semiconductor integrated circuit device, which comprises the following steps:
   (a) patterning a metal film having a first refractory metal, which has a redox equilibrium curve in a water-vapor- and hydrogen-containing gas atmosphere on the side of a higher water vapor than that of silicon, as a principal component, thereby forming a gate electrode over silicon surface on the first main surface of a wafer; and
   (b) heat treating the first main surface having the gate electrode formed thereover, thereby forming a gate insulating film having a film thickness less than 5 nm in terms of $SiO_2$ and containing, as a principal component, silicon oxide over the silicon surface rightly under the gate electrode and.

22. The process as described above in 21, wherein the first refractory metal is molybdenum or tungsten.

23. A process for manufacturing a semiconductor integrated circuit device, which comprises the following steps:
   (a) forming, over the silicon surface on the first main surface of a wafer, a first film to be a gate insulating film, which contains, as a principal component, a first refractory metal having a redox equilibrium curve in a water-vapor- and hydrogen-containing gas atmosphere on the lower water vapor side than that of silicon;
   (b) forming, over the first main surface having the first film formed thereover, a second film to be a gate electrode containing as a principal component, a second refractory metal having the redox equilibrium curve on the higher water vapor side than that of silicon;
   (c) patterning the first and second films, thereby forming the gate electrode; and
   (d) heat treating the first main surface having the gate electrode formed thereover and oxidizing the first film rightly under the gate electrode, thereby converting the first into the gate insulating film.

24. The process as described above in 23, wherein the second refractory metal is molybdenum or tungsten.

25. The process as described above in 23, wherein the first refractory metal is titanium, zirconium or hafnium.

26. A semiconductor integrated circuit device comprising:
   (a) a semiconductor integrated circuit substrate having a silicon surface on the first main surface;
   (b) a gate insulating film containing, as a principal component, a binary oxide or multi-element oxide containing zirconium oxide and hafnium oxide or containing at least two of zirconium oxide,.hafnium oxide and titanium oxide, respectively; and
   (c) a gate electrode disposed over the gate insulating film.

27. A process for manufacturing a semiconductor integrated circuit device, which comprises the following steps:
   (a) forming, over the silicon surface on the first main surface of a wafer, a gate insulating film having a film thickness less than 5 nm in terms of $SiO_2$ and made of a single insulating film containing silicon oxide as a principal component or a composite film thereof with another insulating film;
   (b) forming, over the gate insulating film, a conductive barrier film;
   (c) forming, over the barrier film, a metal film containing a first refractory metal as a main component without disposing, therebetween, an intermediate layer containing polycrystalline silicon as a principal component;

(d) patterning the barrier film and the metal film to form a gate electrode; and (d) heat treating the first main surface having the gate electrode formed thereover in a water-vapor- and hydrogen-containing gas atmosphere having a water vapor/hydrogen partial pressure ratio set at a ratio permitting oxidation of silicon without substantial oxidation of the refractory metal, thereby repairing defects in the gate insulating film rightly under the gate electrode.

28. The process as described above in 27, wherein the first refractory metal is tungsten.

29. The process as described above in 27 or 28, wherein the conductive barrier film contains titanium nitride as a principal component.

30. The process as described above in any one of 27, 28 and 29, wherein the water-vapor- and hydrogen-containing gas further contains a nitrogen or ammonia gas.

31. A process for manufacturing a semiconductor integrated circuit device, which comprises the following steps:

(a) forming, over the main surface of a silicon substrate, a gate insulating film having a film thickness less than 5 nm in terms of $SiO_2$;

(b) forming, over the gate insulating film, a metal film containing as a principal component a refractory metal and heat treating the main surface of the silicon substrate having the metal film formed thereover in a water-vapor- and hydrogen-containing gas atmosphere having a water vapor/hydrogen partial pressure ratio set at a ratio permitting oxidation of silicon without substantial oxidation of the refractory metal, thereby repairing defects in the gate insulating film rightly under the metal film; and (c) patterning the metal film, thereby forming a metal gate electrode.

32. The process as described above in 31, wherein the gate insulating film contains silicon oxide as a principal component.

33. The process as described above in 32, wherein the gate insulating film is formed by thermal oxidation of the main surface of the silicon substrate in a water-vapor- and oxygen-containing gas atmosphere synthesized in the presence of a catalyst.

34. The process as described above in 31, wherein the gate insulating film contains silicon oxynitride as a principal component.

35. The process as described above in 34, wherein the gate insulating film is formed by forming a silicon oxide film on the surface of the substrate and then heat treating the substrate in a nitrogen-gas-containing atmosphere.

36. The process as described above in 31, wherein the gate insulating film contains silicon nitride as a principal component.

37. The process as described above in 36, wherein the gate insulating film is formed by deposition of a silicon nitride film over the substrate by CVD.

38. The process as described above in any one of 31 to 37, wherein the refractory metal is molybdenum or tungsten.

39. A process for manufacturing a semiconductor integrated circuit device, which comprises the following steps:

(a) forming, over the main surface of a silicon substrate, a gate insulating film having a film thickness less than 5 nm in terms of $SiO_2$, (b) forming, over the gate insulating film, a metal film containing a refractory metal as a principal component via a conductive barrier film made of a nitride of a refractory metal and heat treating the main surface of the silicon substrate, which has thereover the metal film and the conductive barrier film formed, in a water-vapor- and hydrogen-containing gas atmosphere having a water vapor/hydrogen partial pressure ratio set at a ratio permitting oxidation of silicon without substantial oxidation of the refractory metal, thereby repairing defects in the gate insulating film rightly under the conductive barrier film; and (c) patterning the metal film and the conductive barrier film, thereby forming a metal gate electrode.

40. The process as described above in 39, wherein the refractory metal constituting the conductive barrier film is molybdenum or tungsten.

41. The process as described above in 39, wherein the refractory metal constituting the conductive barrier film is titanium.

42. The process as described above in 41, wherein the water vapor concentration of the water-vapor- and hydrogen-containing gas atmosphere is not greater than 1%.

43. The process as described above in 41, wherein the water-vapor- and hydrogen-containing gas atmosphere further contains nitrogen or ammonia.

44. A process for manufacturing a semiconductor integrated circuit device, which comprises the following steps:

(a) forming, over the main surface of a silicon substrate, a gate insulating film having a film thickness less than 5 nm in terms of $SiO_2$ and being made of a metal oxide having a dielectric constant larger than silicon dioxide;

(b) forming, over the gate insulating film, a metal film containing as a principal component a refractory metal and heat treating the main surface of the silicon substrate, over which the metal oxide has been formed, in a water-vapor- and hydrogen-containing gas atmosphere having a water vapor/hydrogen partial pressure ratio set at a ratio permitting oxidation of silicon without substantial oxidation of the refractory metal, thereby repairing defects in the gate insulating film rightly under the metal film; and (c) patterning the metal film, thereby forming a metal gate electrode before or after the step for repairing defects in the gate insulating step.

45. The process as described above in 44, wherein the refractory metal is molybdenum or tungsten.

46. The process as described above in 44 or 45, wherein the metal oxide is titanium oxide, zirconium oxide, hafnium oxide, tantalum oxide, aluminum oxide or BST.

47. A process for manufacturing a semiconductor integrated circuit device, which comprises the following steps:

(a) forming, over the main surface of a silicon substrate, a film of a first refractory metal;

(b) forming, over the film of a first refractory metal, a metal film containing as a principal component a second refractory metal, and heat treating the substrate in a water-vapor- and hydrogen-containing gas atmosphere having a water vapor/hydrogen partial pressure ratio set at a ratio permitting the oxidation of the first refractory metal without substantial oxidation of the second refractory metal, thereby converting the first refractory metal into the oxide thereof, whereby a gate insulating film having a film thickness less than 5 nm in terms of $SiO_2$ is formed over the surface of the silicon substrate; and (c) patterning the metal film, thereby forming a metal gate electrode before or after the heat treatment step.

48. The process as described above in 47, wherein the refractory metal is molybdenum or tungsten.

49. The process as described above in 47 or 48, wherein the refractory metal is titanium, zirconium, hafnium or tantalum.

50. A process for manufacturing a semiconductor integrated circuit device, which comprises the following steps:
   (a) forming, over the main surface of a silicon substrate, a film of a refractory metal and heat treating the substrate in a water-vapor- and hydrogen-containing gas atmosphere having a water vapor/hydrogen partial pressure ratio set at a ratio not permitting the substantial oxidation of the film of a refractory metal, thereby forming a gate insulating film having a film thickness less than 5 nm in terms of $SiO_2$ over the interface between the substrate and the film of a refractory metal; and
   (c) patterning the film of a refractory metal, thereby forming a metal gate electrode before or after the heat treatment step.

51. The process as described above in 50, wherein the refractory metal is molybdenum or tungsten.

52. The process as described above in any one of 31 to 51, wherein the gate insulating film has a film thickness less than 4 nm in terms of $SiO_2$.

53. The process as described above in any one of 31 to 52, wherein the gate insulating film has a film thickness less than 3 nm in terms of $SiO_2$.

54. The process as described above in any one of 31 to 53, wherein the gate insulating film has a film thickness ranging from 1.5 nm to 2 nm in terms of $SiO_2$.

55. The process as described above in any one of 31 to 54, wherein the metal gate electrode has a gate length not greater than 0.25 μm.

56. The process as described above in any one of 31 to 55, wherein the metal gate electrode has a gate length not greater than 0.18 μm.

57. The process as described above in any one of 31 to 56, wherein the metal gate electrode has a gate length not greater than 0.1 μm.

BRIEF DESCRIPTION OF THE DRAWINGS

FIG. 3 is a fragmentary cross-sectional view of a semiconductor substrate illustrating the manufacturing method of a CMOS-logic LSI according to Embodiment 1 of the present invention;

FIG. 4 is a fragmentary cross-sectional view of a semiconductor substrate illustrating the manufacturing method of a CMOS-logic LSI according to Embodiment 1 of the present invention;

FIG. 8 is a schematic view illustrating a catalytic system apparatus forming a water vapor+oxygen mixed gas;

FIG. 11($a$) is a explanatory view for defining the water vapor concentration in the water vapor+oxygen mixed gas, while FIG. 11($b$) is an explanatory view for defining the water vapor concentration in the water vapor+hydrogen mixed gas;

FIG. 12 is a fragmentary cross-sectional view of a semiconductor substrate illustrating the manufacturing method of a CMOS-logic LSI according to Embodiment 1 of the present invention;

FIG. 30 is a fragmentary cross-sectional view of a semiconductor substrate illustrating a manufacturing method of a CMOS-logic LSI according to Embodiment 5 of the present invention;

FIG. 31 is a fragmentary cross-sectional view of a semiconductor substrate illustrating the manufacturing method of a CMOS-logic LSI according to Embodiment 5 of the present invention;

FIG. 40 is a fragmentary cross-sectional view of a semiconductor substrate illustrating the manufacturing method of a CMOS-logic LSI according to Embodiment 7 of the present invention;

FIG. 41 is a fragmentary cross-sectional view of a semiconductor substrate illustrating the manufacturing method of a CMOS-logic LSI according to Embodiment 7 of the present invention;

DETAILED DESCRIPTION OF THE PREFERRED EMBODIMENTS

Figure 1:
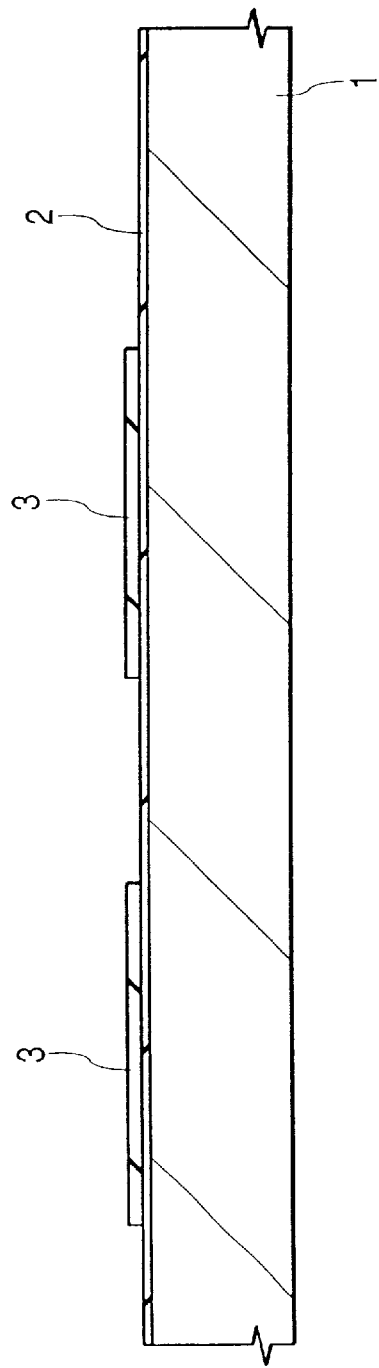
FIG. 1 is a fragmentary cross-sectional view of a semiconductor substrate illustrating a manufacturing method of a CMOS-logic LSI according to Embodiment 1 of the present invention.

The embodiments of the present invention will next be described specifically based on the accompanying drawings. In all the drawings for describing the embodiments, like members of a function will be identified by like reference numerals and overlapping descriptions will be omitted. In the below-described embodiments, description on the same or similar part will not be repeated in principle unless particularly necessary.

In the below-described embodiments, a description will be made after divided in plural sections or in plural embodiments if necessary for convenience's sake. These plural sections or embodiments are not independent each other, but in a relation such that one is a modification example, details or complementary description of a part or whole of the other one unless otherwise specifically indicated. In addition, in the below-described examples, when a reference is made to the number of elements (including the number, value, amount and range), the number of elements is not limited to a specific number but can be not greater than or less than the specific number unless otherwise specifically indicated or in the case it is principally apparent that the number is limited to the specific number. Moreover in the below-described embodiments, it is needless to say that the constituting elements (including element steps) are not always essential unless otherwise specifically indicated or in the case where it is principally apparent that they are essential.

Similarly, in the below-described embodiments, when a reference is made to the shape or positional relationship of the constituting elements, that substantially analogous or similar to it is also embraced. This also applies to the above-described value and range.

The term "semiconductor integrated circuit device" (or electronic device, electronic circuit device, etc.) as used herein means not only that formed over a silicon wafer but also that formed over an SOI (silicon on insulator) substrate, a substrate of TFT liquid crystals or the like unless otherwise specifically indicated.

Embodiment 1

This embodiment is adapted for the manufacture of a CMOS-logic LSI having an integrated circuit constituted of an n-channel MISFET and a p-channel MISFET.

As illustrated in FIG. 1, a single crystal silicon substrate (which will hereinafter be called "substrate" or "wafer") 1 having a specific resistance of about 10 Ωcm was heat treated at about 850° C. to form, over the main surface thereof, a silicon oxide film 2 as thin as about 10 nm, followed by deposition of a silicon nitride film 3 of about 120 nm thick by CVD (Chemical Vapor Deposition) over the silicon oxide film 2. Then, with a photoresist film (not illustrated) as a mask, the silicon nitride film 3 is removed by dry etching from the element isolation region.

The silicon oxide film 2 is formed for the purpose of relaxing a stress put on the substrate 1 upon heat treatment of a silicon oxide film to be embedded inside of the element isolation groove in a step which will be described later or for the purpose of reducing damage on the surface of the substrate 1 caused by ion implantation. The silicon nitride film 3 is, on the other hand, serves as a protector for preventing oxidation of the surface of the substrate 1 (active region) below the silicon nitride film 3 and as a stopper upon polishing the surface of the silicon oxide film to be embedded in the element isolation groove.

Figure 2:
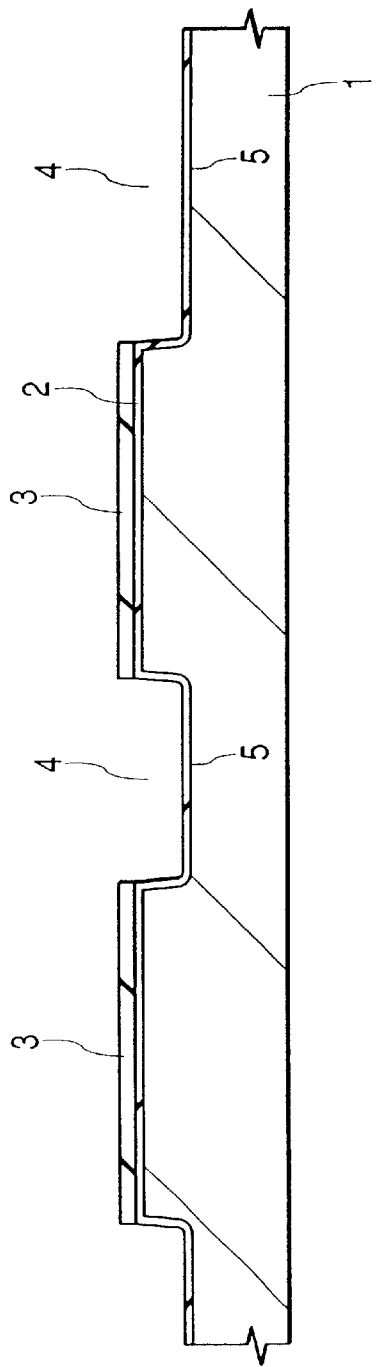
FIG. 2 is a fragmentary cross-sectional view of a semiconductor substrate illustrating the manufacturing method of a CMOS-logic LSI according to Embodiment 1 of the present invention.

As illustrated in FIG. 2, after formation of the element isolation groove 4 of about 350 nm deep in the substrate 1 of the element isolation region by dry etching with the silicon nitride film 3 as a mask, the substrate 1 is heat treated at about 1000° C. to remove the damage layer which has appeared along the inner walls of the element isolation groove 4 by dry etching, whereby a silicon oxide film 5 as thin as about 10 nm is formed along the inner walls of the element isolation groove 4.

As illustrated in FIG. 3, after embedding the silicon oxide film 6 inside of the element isolation groove 4, its surface is flattened. The embedding and flattening of the silicon oxide film 6 are carried out depositing the silicon oxide film 6 of about 600 nm thick over the substrate 1 by CVD, followed by heat treatment of the substrate 1 at about 1000° C. in order to improve the quality of the silicon oxide film 6. Then, the silicon oxide film 6 is polished by chemical mechanical polishing (CMP) using the silicon nitride film 3 as a stopper, whereby the silicon oxide film 6 is left only inside of the element isolation groove 4.

After removal of the silicon nitride film 3 left on the active region of the substrate 1 by wet etching using hot phosphoric acid, B (boron) is ion implanted into a part of the substrate 1 to form a p-type well 7, while P (phosphorus) is ion implanted into the other part of the substrate 1 to form an n-type well 8, as illustrated in FIG. 4.

Figure 5:
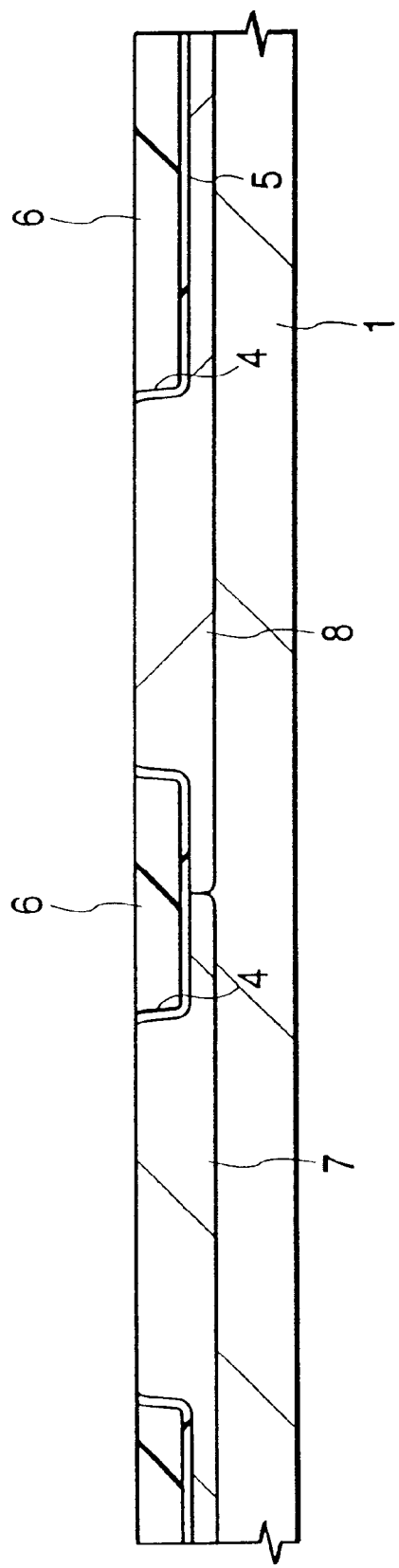
FIG. 5 is a fragmentary cross-sectional view of a semiconductor substrate illustrating the manufacturing method of a CMOS-logic LSI according to Embodiment 1 of the present invention.

Then, in the vicinity of the surface of each of the p-type well 7 and n-type well 8, impurities (B or P) are ion implanted in order to adjust the threshold voltage (Vth) of a MISFET. As illustrated in FIG. 5, the silicon oxide film 2 on the surface of each of the p-type well 7 and n-type well 8 is then removed by washing with an HF (hydrofluoric acid) type washing liquid to expose the surface of the substrate 1 (p-type well 7 and n-type well 8) of the active region.

On the surface of each of the p-type well 7 and n-type well 8, a gate insulating film will next be formed in accordance with the following method.

In general, for the actualization of high velocity and high performance of an MIS device, a thin gate insulating film must be formed to meet a miniaturizing tendency of a MISFET. For example, a gate insulating film having a thickness less than 5 nm is required for a logic device MISFET having a gate length of about 0.25 μm to 0.2 μm. Though depending on the kind of the MIS device, a film thickness less than 4 nm is required for a gate length of about 0.18 μm to 0.14 μm, while a film thickness less than 3 nm is required for a gate length of about 0.13 to 0.1 μm.

As a method for oxidizing the surface of a single crystal silicon substrate at a high temperature, thereby forming a gate insulating film (gate oxide film), known is a wet oxidation method (pyrogenic oxidation) wherein water vapor is formed by combustion of hydrogen in an oxygen atmosphere and the resulting water vapor and oxygen are supplied together to the surface of a substrate, thereby forming an oxidized film. It is however difficult to form, with good reproducibility, a high-quality ultra-thin gate insulating film having a thickness less than 5 nm by this oxidized-film formation method adopting combustion system.

Described specifically, in the above-described oxidized-film formation method making use of a combustion system, it is only possible to control the water vapor concentration of the water vapor+oxygen mixed gas, which is an oxidizing gas, within a high concentration range of about 18 to 40%. When the substrate is heat treated in a water vapor+oxygen mixed gas atmosphere having such a high water vapor concentration, a large amount of an OH group and hydrogen resulting from water vapor is taken into the oxidized film, leading to a tendency to cause structural defects such as Si—H bond or Si—OH bond on the interface with the silicon substrate. These structural defects are cut by application of a voltage stress such as injection of hot carriers and form charge traps, leading to a deterioration in electrical properties such as fluctuations in a threshold voltage or lowering in the withstand voltage.

In addition, in order to form a thermally-oxidized thin film with a uniform thickness, it is necessary to reduce the growth rate of the film compared with the formation of a comparatively thick oxidized film and carry out film formation under more stable oxidizing conditions. The above-described combustion system is not suited for the stable formation of a ultra-thin oxidized film less than 5 nm thick, because the film growth rate is high owing to the high water vapor concentration and the film is inevitably formed in a markedly short time.

For the formation of a clean gate insulating film, a low-quality oxidized film formed on the surface of a silicon substrate must be removed by wet washing in advance. A thin native oxide film is however inevitably formed on the surface of the substrate after wet washing until the oxidation of the substrate (wafer). Moreover in the oxidizing step, an initial oxidized film is undesirably formed on the surface of the substrate by a contact with oxygen in the oxidizing gas prior to the intended oxidation. Particularly in the above-described combustion system, combustion of hydrogen is effected after sufficient supply of oxygen in advance to avoid a risk of hydrogen explosion so that the surface of the substrate is exposed to oxygen for longer hours, resulting in the formation of a thick initial oxidized film.

Thus, the gate oxide film practically includes, in addition to an oxidized film formed by thermal oxidation, a native oxide film and initial oxidized film. These native oxide film and initial oxidized film are inferior in quality to the target oxidized film. It is therefore necessary to reduce a ratio of low-quality oxidized films in the oxidized film for obtaining a high-quality gate insulating film. Formation of a thin oxidized film by the combustion system however increases the ratio of these low quality oxidized films.

For example, supposing that an oxidized film of 9 nm thick is formed by the combustion system and the native oxide film and initially oxidized film in it are 0.7 nm and 0.8 nm thick, respectively, a ratio of the target oxidized film in the total oxidized film is about 83.3%, because the film thickness of the target oxidized film is 7.5 nm from the equation of 9−(0.7+0.8)=7.5. When an oxidized film of 4 nm thick is formed by this combustion system, however, the film thickness of the target oxidized film becomes 2.5 nm as calculated in accordance with the following equation: 4−(0.7+0.8)=2.5 and a ratio of the target oxidized film is lowered to 62.5%, because the thicknesses of the native oxide film and initial oxidized film still remain 0.7 nm and 0.8 nm, respectively. Formation of a ultra-thin silicon oxide film by the conventional combustion system (pyrogenic oxidation system) not only makes it impossible to maintain uniform film thickness or reproducibility but also lowers film quality.

In this embodiment, therefore, a high-quality, ultra-thin gate insulating film is formed by the method as described below. It should be noted that the formation of a gate insulating film is not limited to this method, but it can also be formed using a water vapor+hydrogen gas mixture as described later.

Figure 6:
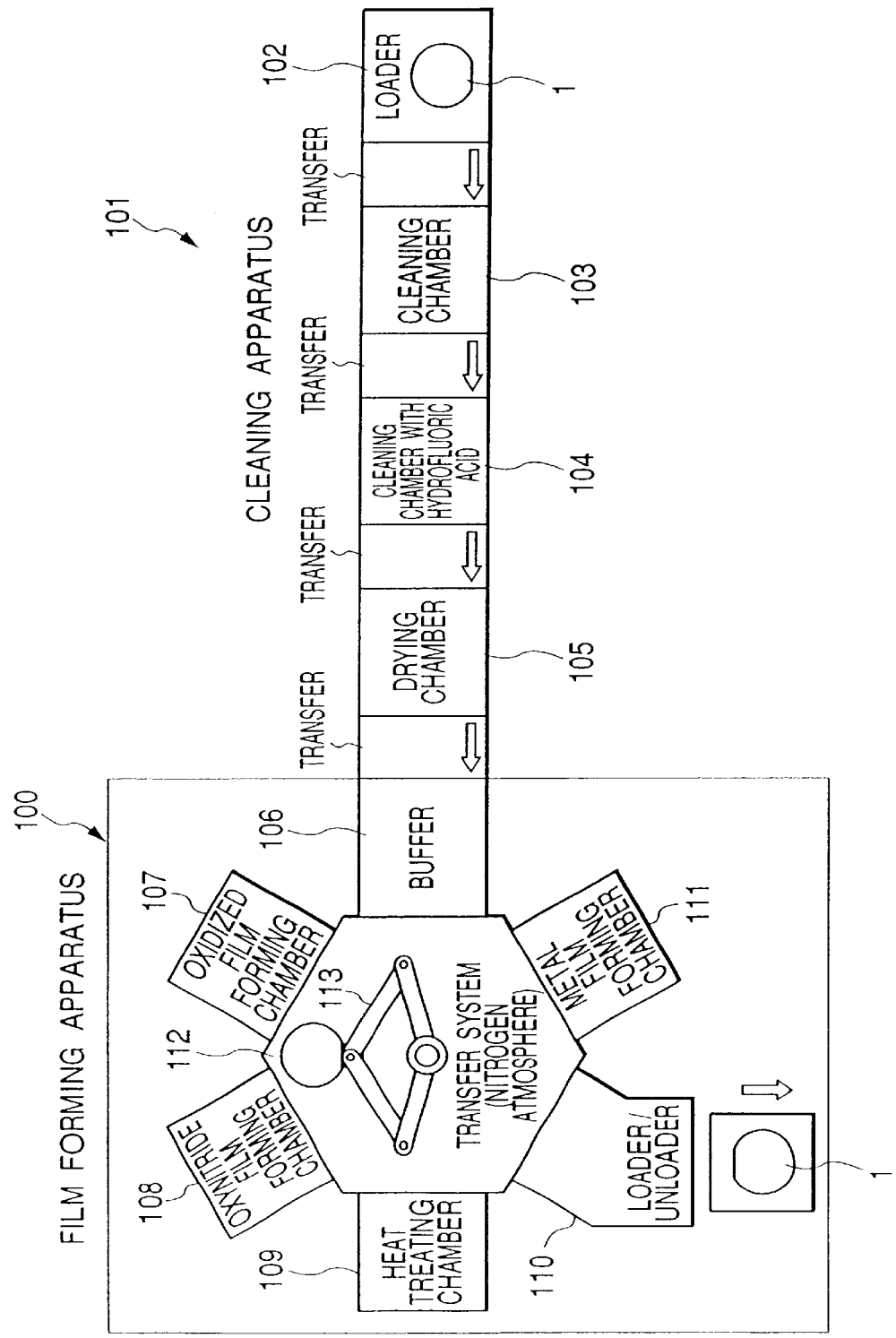
FIG. 6 is a schematic view illustrating a film forming apparatus of a single wafer processing system to be used for the formation of a gate insulating film.

FIG. 6 is a schematic view illustrating a film forming apparatus 100 of a singe wafer processing system used for the formation of a gate insulating film. As illustrated in the drawing, this film forming apparatus 100 is equipped with a washing apparatus 101 for removing the oxide film on the surface of the substrate (wafer) 1 by a wet washing system prior to the formation of the gate insulating film. Adoption of such a consistent system from washing to oxidation makes it possible to transfer the wafer 1, after washing in the washing apparatus 101, to the film forming apparatus 101 in a short time without bringing it in contact with the air so that it is possible to suppress the formation of an undesired native oxide film over the surface of the wafer 1 during the time from the removal of the undesired silicon oxide film 2 to the formation of the gate insulating film.

The wafer 1 loaded on a loader 102 of the washing apparatus 101 is carried into a washing chamber 103 and after washing treatment with a washing liquid such as $NH_4OH+H_2O_2+H_2O$, transferred into a washing chamber 104 with hydrofluoric acid, in which it is washed with diluted hydrofluoric acid ($HF+H_2O$) to remove the silicon oxide film 2 from the surface. The wafer 1 is then transferred into a drying chamber 105, in which it is dried to remove the water vapor from the surface. The water vapor remaining on the surface of the wafer 1 must be removed sufficiently, because it causes structural defects such as Si—H or SiOH in the gate insulating film or on the interface between the gate insulating film and silicon substrate and forms charge traps.

After drying, the wafer 1 is immediately transferred to a buffer 106 of the film forming apparatus 100. This film forming apparatus 100 adopts a multi-chamber system having, for example, an oxidized-film forming chamber 107, oxynitride film forming chamber 108, heat treating chamber 109, loader/unloader 110 and metal film forming chamber 111. And a transfer system 112 at the center of the apparatus is equipped with a robot hand 113 for carrying the wafer 1 in each chamber or carrying it out therefrom. Inside of the transfer system 112, an inert gas atmosphere such as nitrogen is maintained to suppress the formation of a native oxide film on the surface of the wafer 1 which is otherwise caused by mixing of the air in the system. In addition, a water vapor atmosphere having a water vapor content as extremely low as ppb level is maintained inside of the transfer system 112 to suppress the adhesion of water vapor to the surface of the wafer 1. The wafer 1 transferred into the film forming apparatus 100 is then carried into the oxidized-film forming chamber 107 by the robot hand 113, one or two wafers at a time.

Figure 7A:
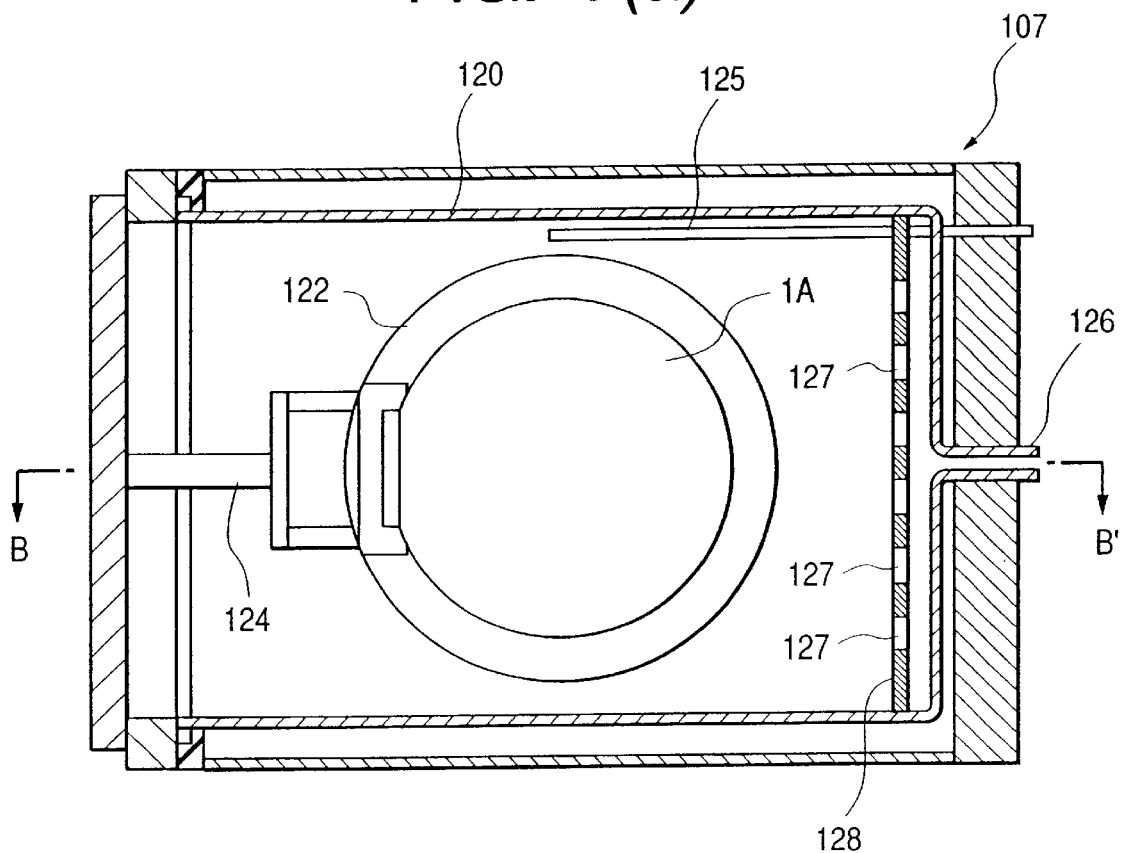
FIG. 7($a$) is a schematic plan view illustrating one example of a specific constitution of an oxide film forming chamber, while FIG. 7($b$) is a cross-sectional view taken along a line B—B' of FIG. 7($a$)
Figure 7B:
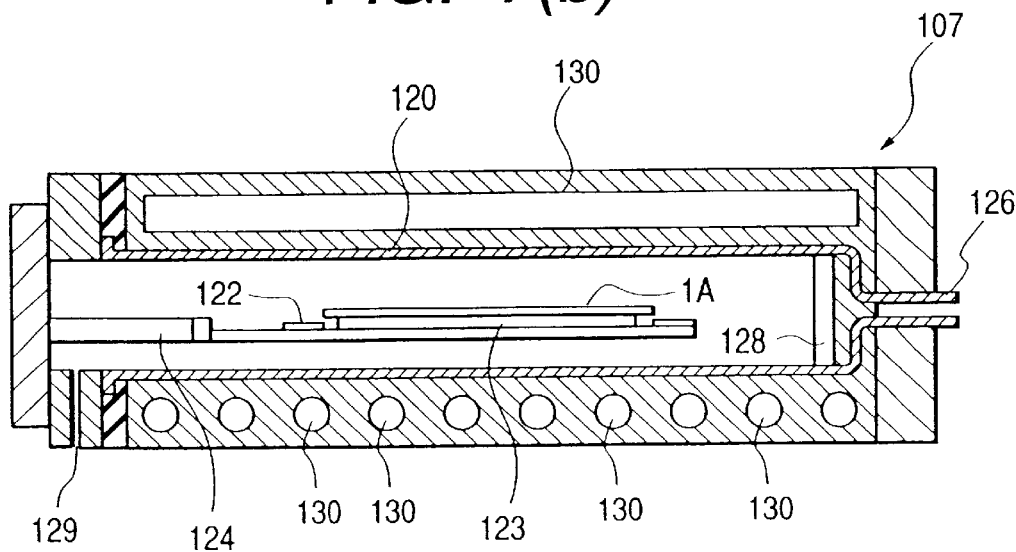

FIG. 7(a) is a schematic plan view illustrating one example of the specific constitution of the oxidized-film forming chamber 107, while FIG. 7(b) is a cross-sectional view taken along line B—B' of FIG. 7(a).

This oxidized-film forming chamber 107 is equipped with a sub-chamber 120 formed of a multiple-wall quartz tube, above and below which lamps 130 for heating the wafer 1 are disposed. Inside of the sub-chamber 120, a disk-shaped soaking ring 122 for uniformly dispersing the heat supplied from the lamps 130 on the whole surface of the wafer 1 is disposed, above which a susceptor 123 for horizontally supporting the wafer 1 is disposed. The soaking ring 122 is made of a heat-resistant material such as quartz or SiC (silicon carbide) and is supported by a supporting arm 124 extending from the wall surface of the sub-chamber 120. In the vicinity of the soaking ring 122, a thermocouple 125 for measuring the temperature of the wafer 1 supported by the susceptor 123 is disposed.

A gas inlet tube 126 for introducing water vapor, oxygen and purge gases into the sub-chamber 120 is connected, at one end, with a part of the wall surface of the sub-chamber 120. The other end of this gas inlet tube 126 is connected with a water-vapor generator of a catalytic system which will be described later. In the vicinity of the gas inlet tube 126, a barrier wall 128 equipped with many through-holes 127 is disposed. The gas introduced into the sub-chamber 120 is uniformly delivered in the sub-chamber 120 through these through-holes 127 of the barrier ball 128. With the other part of the wall surface of the sub-chamber 120, an exhaust tube 129 is connected, at one end, for discharging the gases introduced into the sub-chamber 120.

FIG. 8 is a schematic view illustrating the water vapor+ oxygen mixed gas generator 140 of a catalytic system, which is connected with the sub-chamber 120 of the oxidized-film forming chamber 107. This gas generator 140 is equipped with a reactor 141 made of a heat-resistant, anticorrosive alloy (for example, Ni alloy known as "Hastelloy", trade name) and disposed inside of it are a coil 142 made of a catalyst metal such as Pt (platinum), Ni (nickel) or Pd (palladium) and a heater 143 for heating the coil (or curved facing plate) 142.

Into the reactor 141, a process gas made of hydrogen, that made of oxygen and a purge gas made of an inert gas such as nitrogen or Ar (argon) are introduced from gas reservoirs 144a, 144b, 144c, respectively, via a pipe 145. On the midway of the pipe 145, disposed are mass flow controllers 146a, 146b, 146c for regulating the amount of gases and on-off valves 147a, 147b, 147c each for opening or closing the channel of a gas. The amount and component ratio of the gases introduced into the reactor 141 is precisely controlled by them.

The process gases (hydrogen and oxygen) introduced into the reactor 141 are brought into contact with the coil (or curved facing plate) 142 heated to about 350 to 450° C. and thereby excited, whereby a hydrogen radical is formed from a hydrogen molecule ($H_2 \rightarrow 2H^*$) and an oxygen radical is formed from an oxygen molecule ($O_2 \rightarrow 2O^*$). These two radicals are so chemically active that they immediately react each other and form water vapor ($2H^* + O^* \rightarrow H_2O$). The resulting water vapor is then mixed with oxygen in a connector 148 and diluted to a low concentration, followed by introduction into the sub-chamber 120 of the oxidized-film forming chamber 107 through the gas inlet tube 126.

Since such a water vapor+oxygen mixed gas generator 140 adopting a catalytic system is capable of precisely controlling the amounts of hydrogen and oxygen taking part in the formation of water vapor, the concentration of water vapor introduced, together with oxygen, into the sub-chamber 120 of the oxidized-film forming chamber 107 can be controlled with high precision and within a wide range from an ultra low concentration not greater than ppt to a high concentration of about several 10%. In addition, formation of water vapor occurs instantly with the introduction of the process gases into the reactor 141 so that a desired water vapor concentration is available in real time. Accordingly, hydrogen and oxygen can be introduced simultaneously into the reactor 141 and different from the conventional system for forming water vapor by combustion system, it is not necessary to introduce oxygen prior to the introduction of hydrogen. As a catalyst metal in the reactor 141, any material other than the above-described metals can be used insofar as it can convert a hydrogen or oxygen molecule into a hydrogen or oxygen radical. The process gas may be introduced into the catalyst metal which has been formed into a hollow tube or a filter of fine fibers as well as a coil.

A gate insulating film is formed using the above-described film formation apparatus 100 as follows: The sub-chamber 120 of the oxidized-film forming chamber 107 is opened and then the wafer 1 is loaded on the susceptor 123 while introducing a purge gas (nitrogen or Ar) inside of the sub-chamber 120. The sub-chamber 120 is closed, followed by further introduction of the purge gas to sufficiently change, therewith, the gas inside of the sub-chamber 120. The susceptor 123 is heated in advance by the lamps 130 so as to heat the wafer 1 quickly. The heating temperature of the wafer 1 falls within a range of 800 to 900° C., preferably at about 850° C. Temperatures of the wafer 1 less than 800° C. deteriorate the quality of the gate insulating film, while those exceeding 900° C. tend to roughen the surface of the wafer 1.

Figure 9:
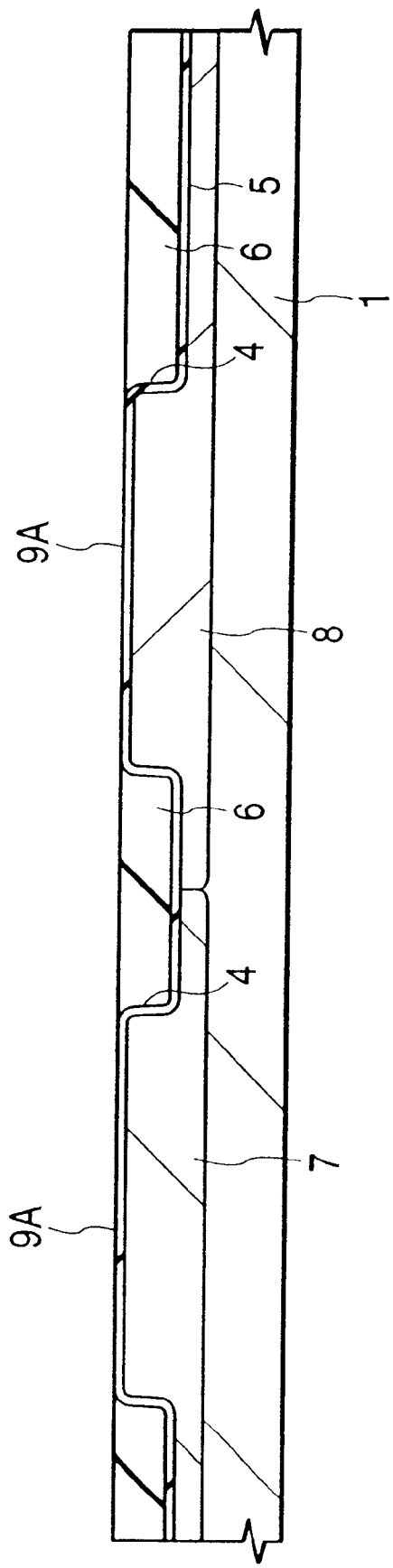
FIG. 9 is a fragmentary cross-sectional view of a semiconductor substrate illustrating the manufacturing method of a CMOS-logic LSI according to Embodiment 1 of the present invention.

Then, oxygen and hydrogen are introduced into the reactor 141 of the water vapor+oxygen mixed gas generator 140. The resulting water vapor is then introduced, together with oxygen, into the sub-chamber 120 to oxidize the surface of the wafer 1 for several minutes, whereby a gate insulating film 9A made of silicon oxide is formed on the surface of the wafer 1 (FIG. 9).

Upon introduction of oxygen and hydrogen into the reactor 141 of the film forming apparatus 100, hydrogen is not introduced prior to oxygen. Introduction of hydrogen prior to oxygen is dangerous, because unreacted hydrogen flows into the sub-chamber 120 heated to a high temperature. When oxygen is introduced prior to hydrogen, this oxygen flows into the sub-chamber 120 and forms a low-quality oxidized film (initial oxidized film) on the surface of the wafer 1 in standby. Accordingly, hydrogen is introduced simultaneously with oxygen or a slightly after oxygen (within 5 seconds) in consideration of the safety of the work. Then, the film thickness of the initial oxidized film undesirably formed on the surface of the wafer 1 can be controlled to the minimum.

Figure 10:
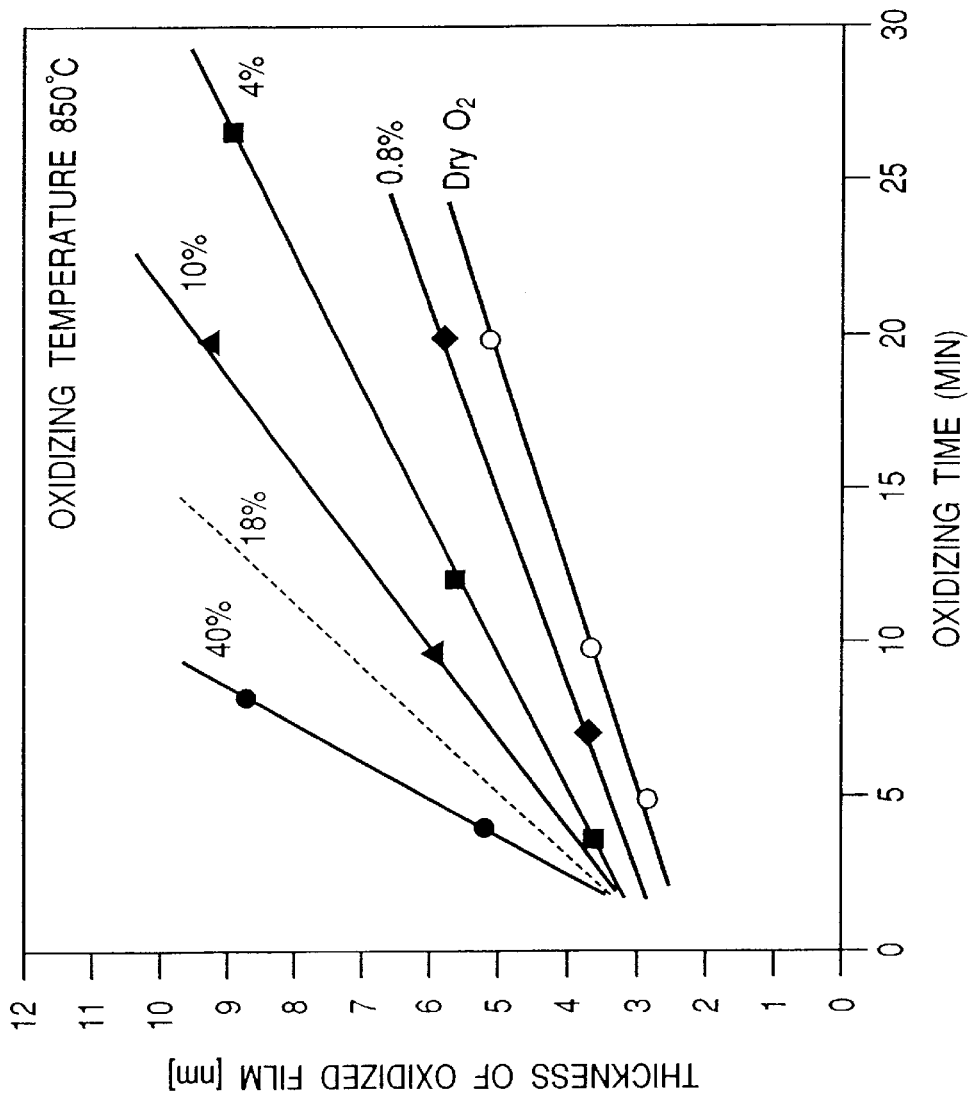
FIG. 10 is a graph illustrating the dependence of a growth rate of an oxidized film on a water vapor concentration.

FIG. 10 is a graph illustrating the dependence of the growth rate of an oxidized film on water vapor concentration, wherein an oxidizing time and thickness of the oxidized film are plotted along the abscissa and ordinate, respectively. As illustrated in the drawing, the growth rate of the oxidized film is the slowest when the water vapor concentration is 0 (dry oxidation) and it becomes higher with an increase in the water vapor concentration. For the formation of the ultra-thin gate insulating film 9A having a thickness less than 5 nm with good reproducibility and uniform thickness, it is therefore effective to lower the water vapor concentration, thereby retarding the growth rate of an oxidized film and carry out film formation under stable oxidizing conditions.

The water vapor concentration to be introduced into the sub-chamber 120 of the oxidized film forming chamber 107 preferably falls within a range of from a concentration, as the lowest limit, permitting the initial voltage resistance better than that upon formation by dry oxidation (water vapor concentration=0) to about 40%, which is the upper limit when the conventional combustion system is adopted. It is preferred to control the water vapor concentration within a range of 0.5% to 5% in order to form, with good reproducibility and uniform thickness, the ultra-thin gate insulating film 9A having a thickness less than 5 nm.

The term "water vapor concentration" of the water vapor+oxygen mixed gas as used herein means a percentage of the water vapor contained in the water vapor+oxygen mixed gas to be introduced into the chamber 120. Supposing that, as illustrated in FIG. 11, the flow rates of oxygen and water vapor introduced into the chamber are designated as $F_O$ and $F_W$, respectively, the water vapor concentration C of the water vapor+oxygen mixed gas is expressed by the following equation: $C=\{F_W/(F_W+F_O)\}\times 100$ (%). The water vapor+oxygen mixed gas to be introduced into the chamber 120 has a normal pressure, but may have a reduced pressure or high pressure. It may contain a purge gas such as nitrogen or Ar.

The term "water vapor concentration" of a water vapor+hydrogen mixed gas which will be described later means a partial pressure ratio, in terms of percentage, of water vapor contained in the water vapor+hydrogen mixed gas. Supposing that the partial pressures of hydrogen and water vapor contained in the water vapor+hydrogen mixed gas are designated as $P_H$ and $P_W$, respectively, the water vapor concentration of the water vapor+hydrogen mixed gas can be expressed by the following equation: $(P_W/P_H)\times 100$ (%). For example, when the partial pressure of hydrogen is set at 99 and that of water vapor is set at 1, the water vapor concentration in the water vapor+hydrogen mixed gas is $[(1/99)\times 100]\approx 1.01\%$.

In this embodiment, the gate insulating film 9A is formed on the surfaces of the p-type well 7 and n-type well by oxidizing the main surface of the wafer 1 while setting the heating temperature of the wafer 1 at 850° C. and the water vapor concentration of the water vapor+oxygen mixed gas at 0.8%. The thickness of the gate insulating film 9A is adjusted to less than 5 nm, less than 4 nm and less than 3 nm when the gate lengths of the gate electrode to be formed over the gate insulating film 9A in the subsequent step are 0.25 to 0.2 $\mu$m, 0.18 to 0.14 $\mu$m and 0.13 to 0.1 $\mu$m, respectively. The term "thickness of the gate insulating film 9A" as used herein means an effective film thickness in terms of $SiO_2$ and it sometimes does not coincide with the actual film thickness.

The gate insulating film 9A made of silicon oxide may be converted into an oxynitride film by the following method. The wafer 1 having the gate insulating film 9A formed thereover is carried into the oxynitride film forming chamber 108 of the film forming apparatus 100 shown in FIG. 6, followed by heat treatment in an atmosphere containing a nitrogen gas such as No (nitrogen oxide) or $N_2O$ (nitrous oxide) to cause segregation of nitrogen in the silicon oxide film.

The above-described conversion into oxynitride is not essential. When the thickness of the gate insulating film 9A becomes less than 5 nm, a stress formed on the interface between this film and the silicon substrate due to a difference therebetween in a thermal expansion coefficient becomes apparent and induces generation of hot carriers. The oxynitride silicon film relaxes this stress. The above-described conversion into oxynitride brings about an improvement in the reliability and withstand voltage of the ultra-thin gate insulating film 9A. Alternatively, the gate insulating film 9A made of an oxynitride silicon film can be formed by the heat treatment of the wafer 1 in a water vapor+oxygen mixed gas added with nitrogen or ammonia.

The wafer having the gate insulating film 9A formed thereover is then transferred to the metal film forming chamber 111 of the film forming apparatus 100 and as illustrated in FIG. 12, a W (tungsten) film 11A to be a gate electrode is deposited over the gate insulating film 9A. The W film 11A is deposited to give a film thickness of about 50 nm by sputtering or CVD. As another material for the gate electrode instead of the W film 11A, an Mo film can be used. Mo is advantageous because it has an electrical resistance lower than W.

In the gate insulating film 9A made of silicon oxide (or silicon oxynitride), defects mainly caused by an Si—O bond deficiency appear upon formation of the film. In addition, when the W film 11A is deposited directly over the gate insulating film 9A without disposing, therebetween, an intermediate layer such as polycrystalline silicon film, a stress generated in the W film 11A upon film formation is applied to the gate insulating film 9A lying rightly under the W film 11A and defects appear in the gate insulating film 9A in the vicinity of the interface between them. When the W film 11A is deposited over the gate insulating film 9A by sputtering, the surface of the gate insulating film 9A is damaged by sputtering or W ions penetrate into the substrate 1 to decrease the thickness of the gate insulating film 9A. When the W film 11A is deposited by CVD, on the other hand, the surface of the gate insulating film 9A is etched by fluorine in a reaction gas ($WF_6$) and the practical film thickness becomes thinner than the desired film thickness. Generation of defects in the gate insulating film 9A rightly under the W film is inevitable by either of the above-described methods. In particular, when the ultra-thin gate insulating film 9A has a film thickness less than 5 nm, a deterioration in its withstand voltage or TDDB (Time-dependent dielectric breakdown) resistance and lowering in the film quality and reliability occur owing to even slight existence of such defects in the film.

The wafer 1 is then heat treated in an oxidizing atmosphere to repair the defects formed in the gate insulating film 9A. Described specifically, the gate insulating film 9A lying rightly under the W film 11A is supplied with oxygen through the W film 11A. This oxygen is introduced into the Si—bond deficient portion existing in the silicon oxide film constituting the gate insulating film 9A, whereby the deficient portion is repaired.

When the defects of the gate insulating film 9A are repaired in an ordinary oxidizing atmosphere, for example, dry oxidation atmosphere, the W film 11A covering the gate insulating film 9A is oxidized simultaneously, leading to an increase in the resistance of the gate electrode. Accordingly, the defects of the gate insulating film 9A must be repaired by a method permitting selective oxidation of only Si without substantial oxidation of W which is a material for the gate electrode.

Figure 13:
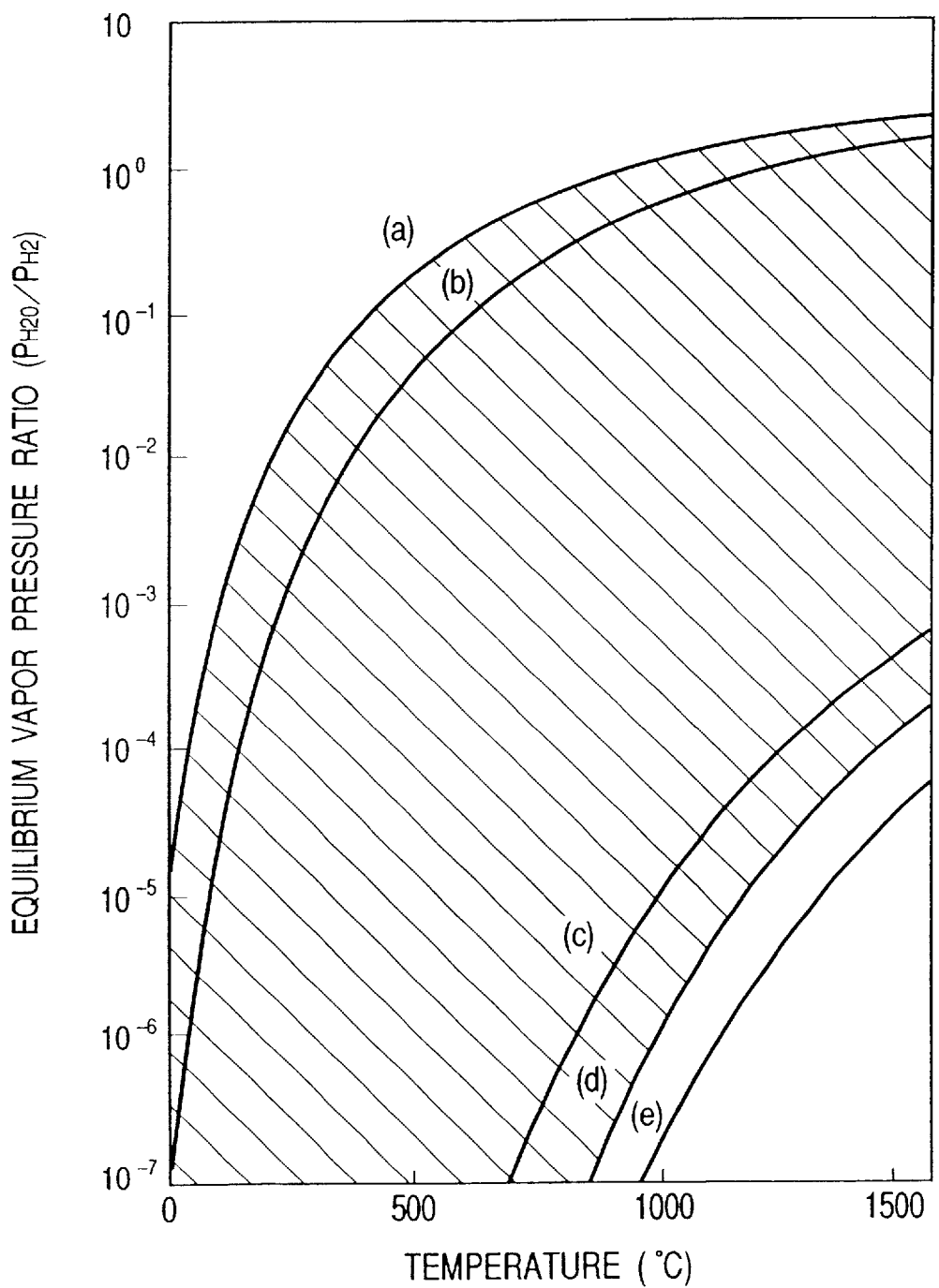
FIG. 13 is a graph illustrating temperature dependence of an equilibrium vapor pressure ratio ($PH_{2O}/PH_2$) of redox reaction conducted using a water vapor+hydrogen mixed gas.

FIG. 13 is a graph illustrating the temperature dependence of an equilibrium vapor pressure ratio ($P_{H2O}/P_{H2}$) of redox reaction using a water vapor+hydrogen mixed gas, wherein curves (a) to (e) represent equilibrium vapor pressure ratios of Mo (molybdenum), Ta (tantalum), Si and Ti (titanium), respectively.

As illustrated in the drawing, only Si can be oxidized selectively without oxidizing W by setting a water vapor/ hydrogen partial pressure ratio within a range sandwiched between the curve (a) and curve (d). In other words, the defects of the gate insulating film 9A can be repaired by oxidizing it without oxidation of the W film 11A by heat treating the wafer 1 in the water vapor+hydrogen mixed gas atmosphere having a water vapor/hydrogen partial pressure ratio set within a range between the curve (a) and curve (d).

Similarly, only Si can selectively be oxidized without oxidation of Mo by setting a water vapor/hydrogen partial pressure ratio within a range sandwiched between the curve (b) and curve (d) in FIG. 13. In the case where Mo is employed as a gate electrode material, the defects of the gate insulating film 9A can be repaired without oxidation of the Mo film by heat treating the wafer 1 in the water vapor+ hydrogen mixed gas atmosphere having a water vapor+ hydrogen partial pressure ratio set within the above-described range.

The defects of the gate insulating film 9A are repaired by transferring the wafer 1, which has the W film 11A formed thereover, from the metal film forming chamber 111 to the heat treating chamber 209, each in the film forming apparatus 100. The sub-chamber of the heat treating chamber 209 has a structure similar to the sub-chamber 120 of the oxidized-film forming chamber 107 so that its illustration is omitted.

Figure 14:
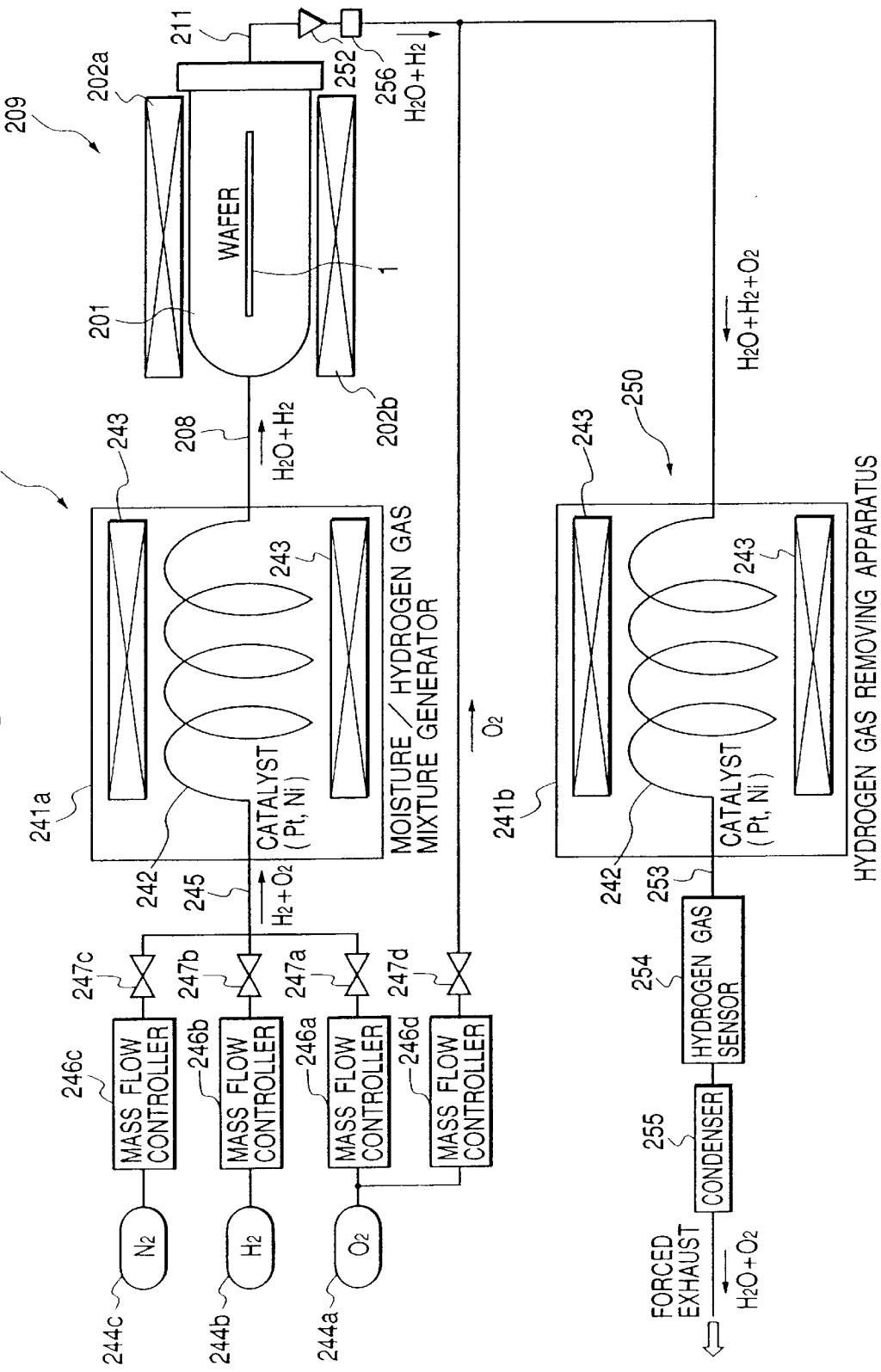
FIG. 14 is a schematic view illustrating a water vapor+hydrogen mixed gas generator and a hydrogen gas removing apparatus, each adopting a catalytic system.

FIG. 14 is a schematic view illustrating a water vapor+ hydrogen mixed gas generator 240 and a hydrogen gas removing apparatus 250, each adopting a catalytic system and being connected to the heat treating apparatus 209.

The water vapor+hydrogen mixed gas generator 240 has a structure similar to that of the water vapor+oxygen mixed gas generator 140 employed for the formation of the gate insulating film 9A. Described specifically, the water vapor+ hydrogen mixed gas generator 240 is equipped with a reactor 241 made of a heat-resistant anti-corrosive alloy and inside of the reactor, a coil 242 made of a catalyst metal and a heater 243 for heating the coil 242 are disposed.

Into the reactor 241a, a process gas made of hydrogen, a process gas made of oxygen and a purge gas made of an inert gas such as nitrogen or Ar (argon) are introduced from gas reservoirs 244a, 244b and 244c via a pipe 245, respectively. Between the pipe 145 and gas reservoirs 244a, 244b, 244c, disposed are mass flow controllers 246a, 246b and 246c for regulating the amount of a gas and on-off valves 247a, 247b and 247c for opening or closing the channel of a gas, respectively. The amount and component ratio of the gas introduced into the reactor 241a are precisely controlled by them.

The process gases (hydrogen and oxygen) introduced into the reactor 241a are brought into contact with the coil 242 heated to about 350 to 450° C. and thereby excited, whereby a hydrogen radical is formed from a hydrogen molecule ($H_2 \rightarrow 2H^*$) and an oxygen radical is formed from an oxygen molecule ($O_2 \rightarrow 2O^*$). These two radicals are so chemically active that they immediately react each other and form water vapor ($2H^* + O^* \rightarrow H_2O$). By introducing a hydrogen/oxygen mixed gas containing hydrogen at a ratio exceeding than the water-vapor forming molar ratio (hydrogen:oxygen=2:1), a water vapor+hydrogen mixed gas can be generated. The water vapor+hydrogen mixed gas thus generated is introduced into the heat treating chamber 209 through a gas inlet tube 208.

Since such a gas generator 240 adopting a catalytic system is, similar to the above-described water vapor+oxygen mixed gas generator 140, capable of precisely controlling the amounts and ratio of hydrogen and oxygen taking part in the formation of water vapor, the concentration of water vapor in the water vapor+hydrogen mixed gas to be introduced into the chamber of the heat treating chamber 209 can be controlled with high accuracy and at the same time, within a wide range from an ultra low concentration in the order of ppb to a high concentration of about several 10%. In addition, formation of water vapor occurs instantly with the introduction of the process gases into the reactor 241a so that the water vapor+hydrogen mixed gas having a desired water vapor concentration is available in real time. This makes it possible to control the mixing of foreign matters in the reactor to the minimum so that a clean water vapor+hydrogen mixed gas can be introduced into the heat treating chamber 209.

The defects of the gate insulating film 9A are repaired by transferring the wafer 1 into the sub-chamber of the heat treating chamber 209 while introducing a purge gas (nitrogen or Ar) thereinto, closing the sub-chamber, further introducing the purge gas to sufficiently carry out gas change in the sub-chamber and then introducing a water vapor+hydrogen mixed gas into the sub-chamber. At this time, the wafer 1 is heated at a temperature preferably within a range of 700 to 800° C., more preferably about 750° C. The water vapor concentration of the water vapor+hydrogen mixed gas preferably falls within a range of 0.5 to 30%, more preferably within a range of 1% to 20%.

An oxidizing gas (OH group) derived from the water vapor in the water vapor+hydrogen mixed gas is penetrated into the gate insulating film 9A via the W film 11A by the heat treatment under the above-described conditions, whereby oxygen is fed to the oxygen deficient portion of the Si—O bond and defects are repaired. Since the W film 11A is not oxidized by the heat treatment even under these conditions, the gate electrode is free from a rise in its resistance.

Upon film formation, a stress is accumulated in the W film 11A so that when a gate electrode is formed by patterning of the W film 11A, a residual stress in the film concentrates on the end portion of the side wall of the gate electrode, thereby lowering the hot carrier resistance of the gate insulating film 9A in this region. The above-described heat treatment for repairing the defects of the gate insulating film 9A is able to relax the stress accumulated in the W film 11A, making it possible to simultaneously control a lowering in the hot carrier resistance of the gate insulating film 9A at the end portion of its side wall after the formation of the gate electrode.

After completion of the defect repairing work of the gate insulating film 9A, the water vapor+hydrogen mixed gas in the heat treating chamber 209 is discharged through an exhaust pipe 211 as illustrated in FIG. 14, cooled to 500° C. or lower by a cooler 256 and then introduced into a reactor 241b of a hydrogen gas removing device 250. At this time, an oxygen gas is fed into the exhaust pipe 211 from the gas reservoir 244a through a pipe 251 and introduced into the reactor 241b together with a water vapor+hydrogen mixed gas. Between the gas reservoir 244a and pipe 251, a mass flow controller 246d for regulating the amount of the oxygen gas and an on-off valve 247d for opening or closing the channel of the oxygen gas are disposed and the amount of the oxygen gas introduced into the reactor 242b is controlled precisely by them. On the midway of the exhaust pipe 211, a back-flow valve 252 for preventing the oxygen gas from flowing back to the heat treating chamber 209 is disposed.

The reactor 241b of the hydrogen gas removing apparatus 250 is, similar to the reactor 241a of the gas generator 240, made of a heat-resistant anticorrosive alloy and has therein a coil 242 made of a catalyst metal and a heater 243 for heating this coil 242 are disposed. The water vapor+hydrogen mixed gas and oxygen gas introduced into this reactor 241b are brought into contact with the coil 242 heated to about 350 to 450° C. and thereby excited. By the prompt reaction of a hydrogen radical generated from a hydrogen molecule with an oxygen radical generated from an oxygen molecule, water vapor is produced.

Upon introduction of the water vapor+hydrogen mixed gas discharged from the heat treating chamber 209 into the reactor 241b, oxygen is simultaneously introduced in an amount of at least ½ (molar ratio) of the hydrogen amount in the mixed gas to convert the hydrogen gas into water by complete oxidation. This oxygen gas may be introduced into the reactor 241b prior to the introduction of the water vapor+hydrogen mixed gas or introduced continuously into the reactor 241b through the pipe 251 and exhaust pipe 211. The water vapor generated in the reactor 241b is discharged outside, together with an excess oxygen gas, through the exhaust pipe 253. On the midway of this exhaust pipe 253, disposed are a hydrogen gas sensor 254 for confirming the complete conversion of the hydrogen gas into water and a cooler 255 for liquefying the high-temperature water vapor discharged from the reactor.

Figure 15:
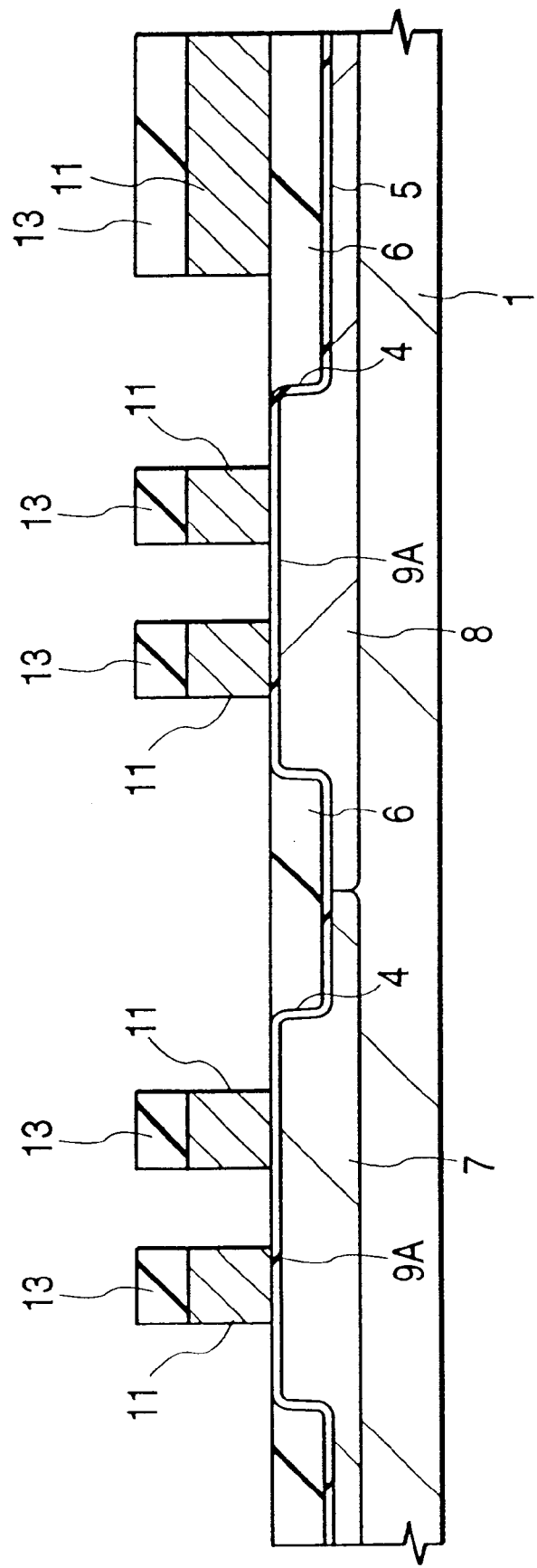
FIG. 15 is a fragmentary cross-sectional view of a semiconductor substrate illustrating the manufacturing method of a CMOS-logic LSI according to Embodiment 1 of the present invention.

As illustrated in FIG. 15, a silicon nitride film 13 is deposited over the W film 11A to a film thickness of about 50 nm to 100 nm by CVD, followed by formation of a gate electrode 11 by patterning the silicon nitride film 13 and W film 11A by dry etching with a photoresist film 14 as a mask. The gate electrode 11 is formed to have a gate length falling within a range of 0.25 to 0.1 $\mu$m. The gate electrode 11 made of W has a sheet resistance not greater than 2 $\Omega/\square$ so that the operation rate of a MISFET can be improved. The stress in the W film 11A caused by the deposition of the silicon nitride film 13 may be alleviated by carrying out heat treatment again by using the water vapor+hydrogen mixed gas prior to the step for forming the gate electrode 11 by patterning of the W film 11A.

Figure 16:
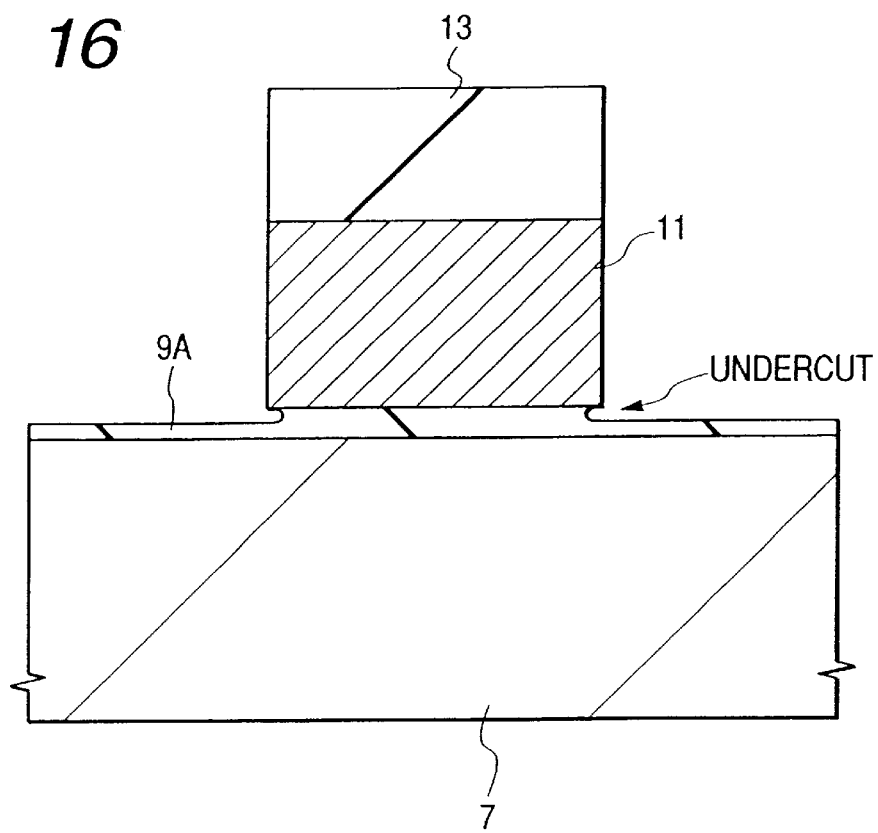
FIG. 16 is a fragmentary enlarged cross-sectional view of a semiconductor substrate illustrating the manufacturing method of a CMOS logic-LSI according to Embodiment 1 of the present invention.

After removal of the photoresist film 14 used for processing of the gate electrode 11 by ashing, a dry etching residue or ashing residue which has remained on the surface of the substrate 1 is removed by an etchant such as hydrofluoric acid. As illustrated in FIG. 16, this wet etching not only etches a portion of the gate insulating film 9A in a region other than that under the gate electrode 11 but also causes anisotropic etching and undercut of the gate insulating film 9A below the side walls of the gate electrode 11, leading to a lowering in the withstand voltage of the gate insulating film 9A. Heat treatment (re-oxidizing treatment) is therefore conducted for regenerating a portion of the gate insulating film 9A etched by the above-described wet etching. With regards to this re-oxidizing treatment, a technique by the present inventors is described in Japanese Patent Application No. HEI 10(1998)-138939, Japanese Patent Application Laid-Open No. HEI 10(1998)-335652 and U.S. Pat. No. 09-086568 corresponding thereto.

In the re-oxidizing treatment, similar to the above-described defect repairing treatment of the gate insulating film 9A, Si (substrate 1) must be oxidized without oxidizing the W film (11A) constituting the gate electrode 11 so that the wafer (substrate 1) is carried in the heat treating chamber 209 and then heat treated in a water vapor+hydrogen mixed gas atmosphere generated by the water vapor+hydrogen mixed gas generator 240 adopting a catalytic system. The water vapor concentration of this water vapor+hydrogen mixed gas may be set similar to that employed for defect repairing of the gate insulating film 9A. Heat treating temperature is set equal to or slightly lower than that employed upon defect repairing of the gate insulating film 9A.

Figure 17:
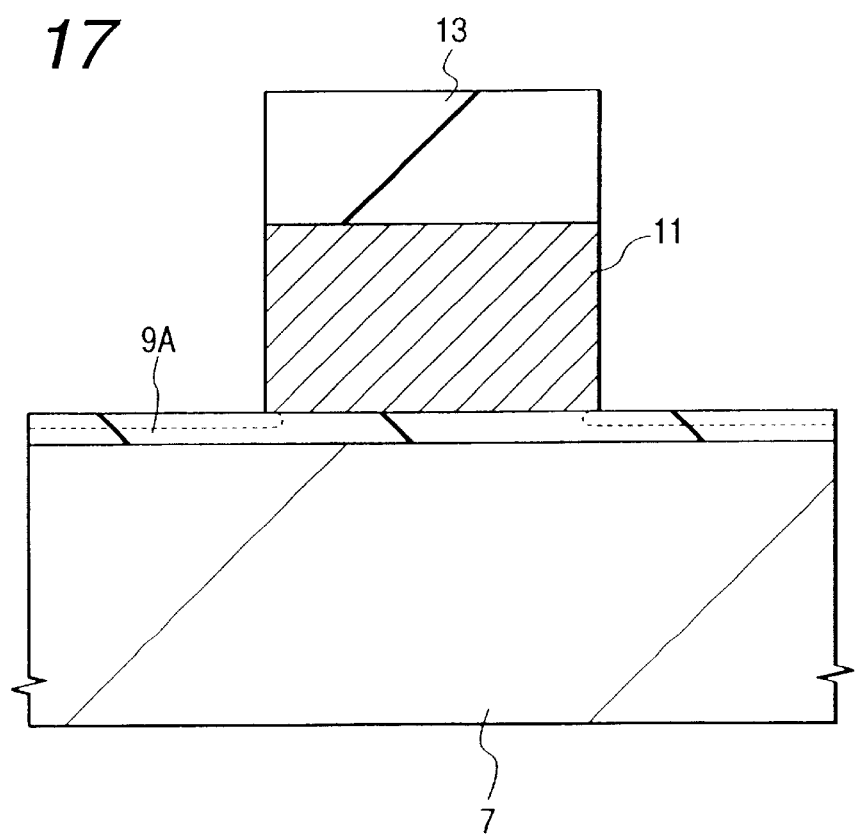
FIG. 17 is a fragmentary enlarged cross-sectional view of a semiconductor substrate illustrating the manufacturing method of a CMOS-logic LSI according to Embodiment 1 of the present invention.

By this heat treatment, the surface of the substrate (Si) 1 is oxidized, whereby the gate insulating film 9, which has been etched and thinned in the wet etching step, restores the thickness before etching, resulting in an improvement in the profile undercut at the end portion of the side wall of the gate electrode 11 (FIG. 17).

By the above-described re-oxidizing treatment for long hours, however, the oxidized film in the vicinity of the end portion of the gate electrode 11 becomes unnecessarily thick, causing offset at the end portion of the gate electrode 11 or difference in the threshold voltage (Vth) of a MISFET from the designed value. In addition, it causes a problem such as shortening of the effective channel length compared with the processed value of the gate electrode 11. Particularly in a fine MISFET having a gate length less than 0.25 $\mu$m, a permissible amount of narrowing from the designed gate processing size is severely limited in consideration of device designing, because a slight increase in the narrowing amount causes a drastic decrease in the threshold voltage owing to short channel effects. It is therefore desired to set the upper limit of the thickness of the oxidized film, to be increased by the re-oxidizing treatment, to about 50% of the thickness of the gate insulating film 9A.

The defects of the gate insulating film 9A can also be repaired after formation of the gate electrode 11 by patterning of the W film 11A. In other words, the repair of the defects and re-oxidizing treatment of the gate insulating film 9A can be carried out simultaneously. In this case, the upper portion of the gate electrode 11 is covered with the silicon nitride film 13 so that oxygen is fed to the gate insulating film 9A rightly under the electrode 11 through the side walls of the gate electrode 11.

Figure 18:
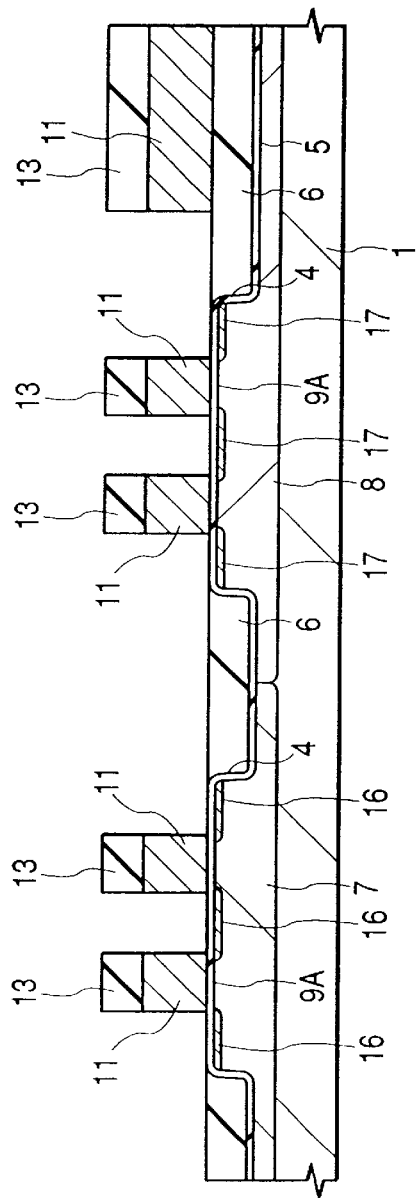
FIG. 18 is a fragmentary cross-sectional view of a semiconductor substrate illustrating the manufacturing method of CMOS-logic LSI according to Embodiment 1 of the present invention.

As illustrated in FIG. 18, n$^-$ type semiconductor regions 16 are formed in the p-type wells 7 on both sides of the gate electrode 11 by ion-implantation of n type impurities, for example, P (phosphorus) into the p-type wells 7, while p$^-$ type semiconductor regions 17 are formed in the n-type wells 8 on both sides of another gate electrode 11 by ion-implantation of p type impurities, for example, B (boron) into the n-type wells 7.

Figure 19:
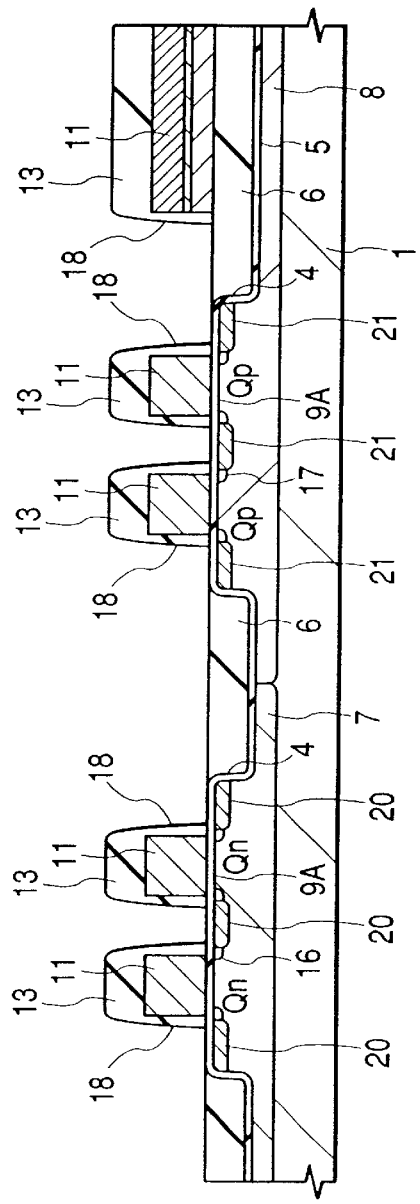
FIG. 19 is a fragmentary cross-sectional view of a semiconductor substrate illustrating a manufacturing method of CMOS-logic LSI according to Embodiment 1 of the present invention.

As illustrated in FIG. 19, side wall spacers 18 are then formed on side walls of the gate electrode 11. These side wall spacers 11 are each formed by subjecting, for example, a silicon nitride film of about 50 nm thick, which has been deposited by CVD over the substrate 1, to anisotropic etching to leave a portion of this silicon nitride film on the side wall of the gate electrode 11.

Then, n$^+$ type semiconductor regions 20 (source, drain) are formed by ion-implantation of n type impurities, for example, As (arsenic) into the p-type wells 7, while p$^+$ type semiconductor regions 21 (source, drain) are formed by ion-implantation of p type impurities, for example, B (boron) into the ri-type wells 8. By the steps so far described, an n-channel type MISFETQn is formed in the p-type well 7, while a p-channel type MISFETQp is formed in the n-type well 8.

Figure 20:
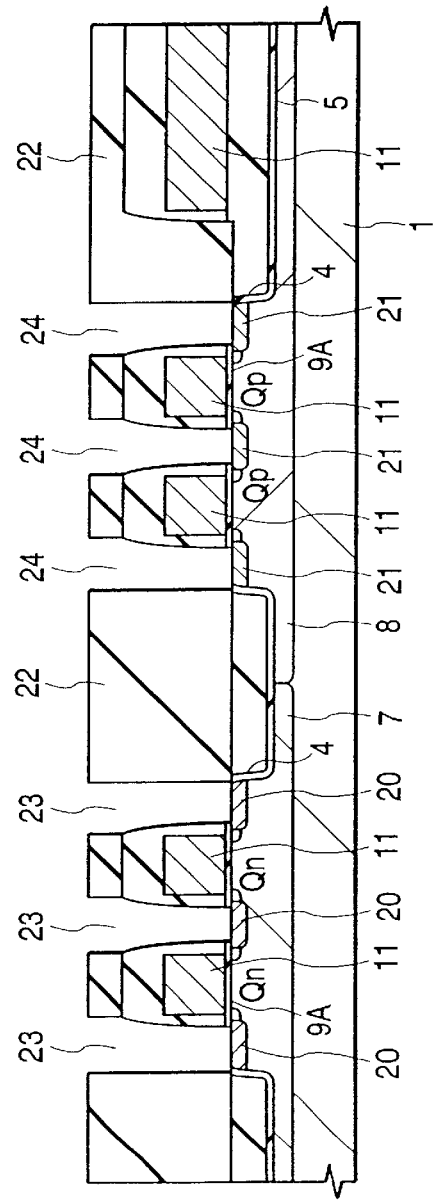
FIG. 20 is a fragmentary cross-sectional view of a semiconductor substrate illustrating a manufacturing method of CMOS-logic LSI according to Embodiment 1 of the present invention.

As illustrated in FIG. 20, a silicon oxide film 22 is deposited by CVD over the substrate 1. After flattening its surface by chemical mechanical polishing, the silicon oxide film 22 is dry etched with a photoresist film (not illustrated) as a mask, whereby a contact hole 23 is formed above the n$^+$ semiconductor regions 20 (source, drain) and a contact hole 24 is formed above the p$^+$ semiconductor regions 21 (source, drain).

Figure 21:
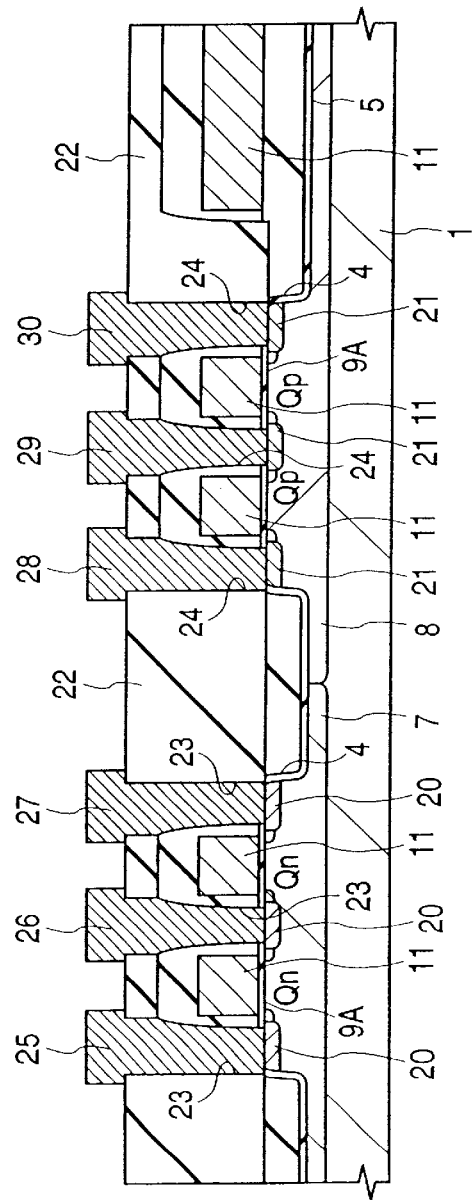
FIG. 21 is a fragmentary cross-sectional view of a semiconductor substrate illustrating the manufacturing method of a CMOS-logic LSI according to Embodiment 1 of the present invention.

As illustrated in FIG. 21, after deposition of a W film over the silicon oxide film 22 by CVD or sputtering, the W film is patterned with a photoresist film (not illustrated) as a mask, whereby interconnections 25 to 30 are formed above the silicon oxide film 22.

Embodiment 2

When a metal film such as W or Mo film deposited directly on a gate insulating film made of silicon oxide is heat treated, a high-resistance silicide compound is formed on the interface between them and it happens to deteriorate the withstand voltage of the gate insulating film. As a countermeasure against it, known is a process for forming, between the W film (or Mo film) which is a material of a gate electrode and a gate insulating film which lies under the W film and made of silicon oxide, a conductive barrier film for preventing the reaction on the interface therebetween. Nitrides of a refractory metal, which are conductive materials having low reactivity by themselves and high heat resistance, such as titanium nitride (TiN), tungsten nitride (WN) and molybdenum nitride (MoN) are suited as materials for the conductive barrier film. Nitrides of tantalum (Ta), zirconium (Zr) or hafnium (Hf) can also be employed.

Figure 22:
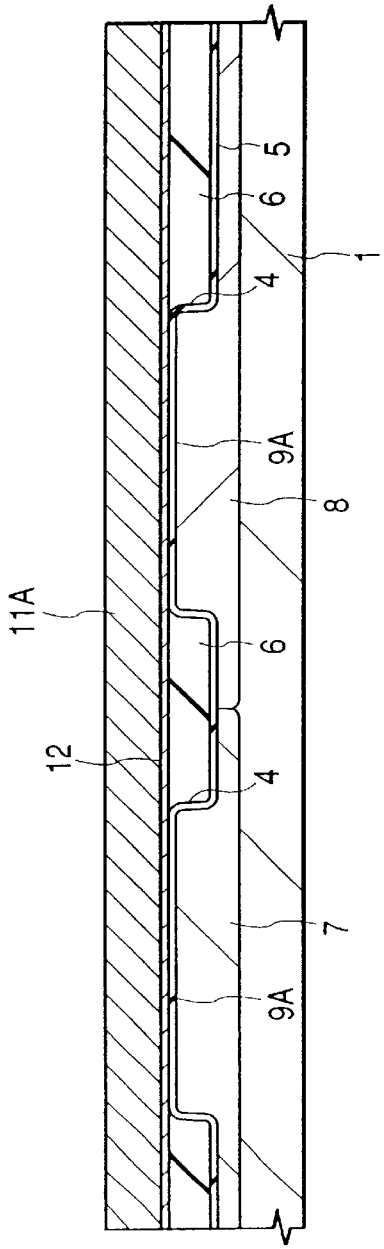
FIG. 22 is a fragmentary cross-sectional view of a semiconductor substrate illustrating the manufacturing method of a CMOS-logic LSI according to Embodiment 2 of the present invention.

When the conductive barrier film is formed between the W film (or Mo film) and the underlying gate insulating film made of silicon oxide, the defects of the gate insulating film 9A are repaired in accordance with the following manner:

As illustrated in FIG. 22, after formation of the gate insulating film 9A which is made of silicon oxide (or silicon oxynitride) and has a film thickness less than 5 nm on the surface of each of the p-type well 7 and n-type well 8 in a similar manner to Embodiment 1, a conductive barrier film 12 is formed over the gate insulating film 9A, followed by the formation of a W film 11A (or Mo film) of about 50 nm thick by sputtering or CVD over the conductive barrier film 12. The conductive barrier film 12 is made of a WN film, MoN film or TiN film deposited by CVD or sputtering and has a thickness of about 5 nm.

Under this state, heat treatment is then carried out to repair the defects of the gate insulating film 9A by a method which permits selective oxidation of only Si without oxidizing W (or Mo) which is a gate electrode material and a metal (W, Ti or Mo) constituting the conductive barrier film.

When the gate electrode material is W and the barrier material is WN, for example, defects of the gate insulating film 9A can be repaired, without oxidation of the gate electrode material and barrier material, by heat treatment in a water vapor+hydrogen mixed gas atmosphere having a water vapor+hydrogen partial pressure ratio set within a range sandwiched between the curve (a) and curve (d) of FIG. 13. When the gate electrode material is Mo and the barrier material is MoN, for example, defects of the gate insulating film 9A can be repaired, without oxidation of the gate electrode material and barrier material, by heat treatment in a water vapor+hydrogen mixed gas atmosphere having a water vapor+hydrogen partial pressure ratio set within a range sandwiched between the curve (b) and curve (d) of FIG. 13. In these cases, the defects of the gate insulating film 9A can be repaired in a similar manner to Embodiment 1.

When W (or Mo) and TiN are employed as the gate electrode material and barrier material, respectively, it is impossible to selectively oxidize Si without substantial oxidation of Ti, because the oxidizing rate of Ti is higher than that of Si in a water vapor+hydrogen mixed gas atmosphere as illustrated in FIG. 13. In this case, defect repairing of the gate insulating film 9A in a similar manner to Embodiment 1 inevitably oxidizes the barrier material, leading to a rise in the resistance of the gate electrode.

In this case, however, by setting the concentration of water vapor in the water vapor+hydrogen mixed gas at markedly low by using the above-described water vapor+ hydrogen mixed gas generator adopting a catalytic system to retard the oxidizing rates of Ti and Si, it is possible to suppress the oxidation of the barrier material to the minimum level, thereby controlling an increase in the resistance of the gate electrode within a range not causing a problem in practical use. More specifically, heat treatment may be carried out in a water vapor+hydrogen mixed gas atmosphere having a water vapor concentration of 1% or less, preferably several ppm to 100 ppm.

As another method for preventing oxidation of a gate electrode material and suppressing oxidation of a barrier material to the minimum level, thereby repairing the defects of the gate insulating film 9A, heat treatment is carried out in a water vapor+hydrogen mixed gas atmosphere added with nitrogen or ammonia and having a water vapor/hydrogen partial pressure ratio set within a range sandwiched between the curve (a) (curve (b) in the case where Mo is used as a gate electrode material) and curve (d) of FIG. 13.

Heat treatment in the water vapor+hydrogen mixed gas atmosphere added with nitrogen or ammonia causes diffusion of an OH group and nitrogen into the conductive barrier film 12 through the W (or Mo) film 11A, leading to a competition between the oxidation reaction of Ti by an OH group and nitriding reaction of Ti. It is therefore possible to repair the defects of the gate insulating film 9A while controlling the oxidation of the conductive barrier film 12. In this case, it is desired to lower the water vapor concentration, thereby retarding the oxidizing rate of the conductive barrier film 12 as much as possible. When the above-described gas is employed, the gate insulating film 9A made of a silicon oxide film is partially converted into a silicon oxynitride film, so that the reliability and withstand voltage of the ultra-thin gate insulating film 9A are improved further.

Figure 23:
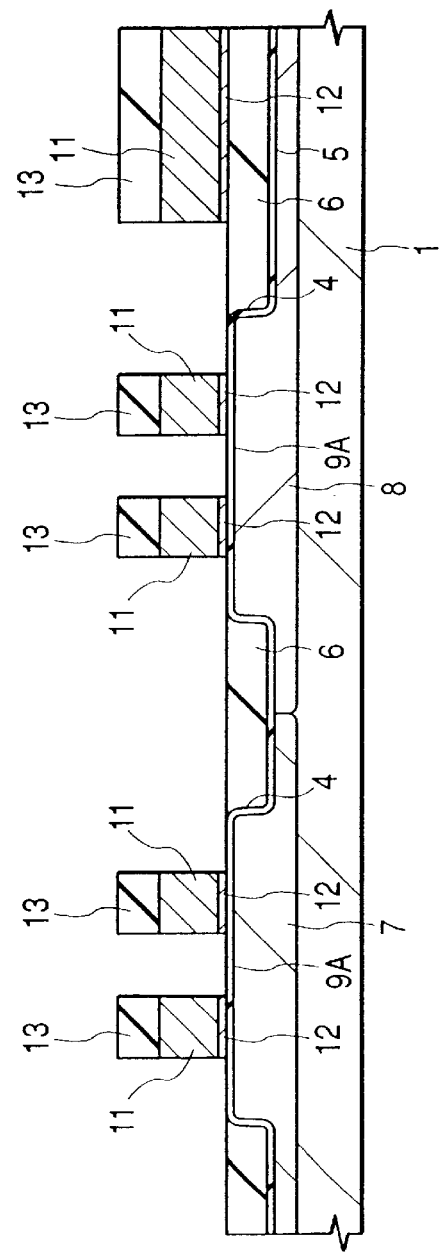
FIG. 23 is a fragmentary cross-sectional view of a semiconductor substrate illustrating the manufacturing method of a CMOS-logic LSI according to Embodiment 2 of the present invention.

As illustrated in FIG. 23, after deposition of a silicon nitride film 13 of about 50 nm to 100 nm thick by CVD over the W film 11A, the silicon nitride film 13 and W film 11A are patterned by dry etching with a photoresist film 14 as a mask, whereby a gate electrode 11 is formed For regeneration of the etched portion of the gate insulating film 9A, heat treatment (re-oxidizing treatment) is carried out in a similar manner to Embodiment 1. It should be noted that in this Embodiment 2, the defect repairing and re-oxidation of the gate insulating film 9A can be carried out in one step after the formation of the gate electrode 11.

Embodiment 3

When the thickness of a gate insulating film made of silicon oxide is decreased to less than 5 nm, particularly less than 3 nm in terms of $SiO_2$, lowering in the withstand voltage due to generation of a direct tunnel current or hot carriers resulting from a stress becomes eminent. In this embodiment, as a countermeasure against such problems, a gate insulating film is formed of a silicon nitride film or a composite of a silicon oxide film and a silicon nitride film.

Since a silicon nitride film has a higher dielectric constant than a silicon oxide film, the thickness of the silicon nitride film in terms of $SiO_2$ becomes thinner than the actual thickness. By forming the gate insulating film from a single silicon nitride film or a composite film thereof with silicon oxide, it is possible to thicken the effective thickness compared with a gate insulating film formed of a silicon oxide film, whereby the above-described problem can be overcome. In addition, it also serves as a countermeasure against the above-described problem occurring when a W film is deposited directly on the gate insulating film made of a silicon oxide film.

Figures 24, 25:
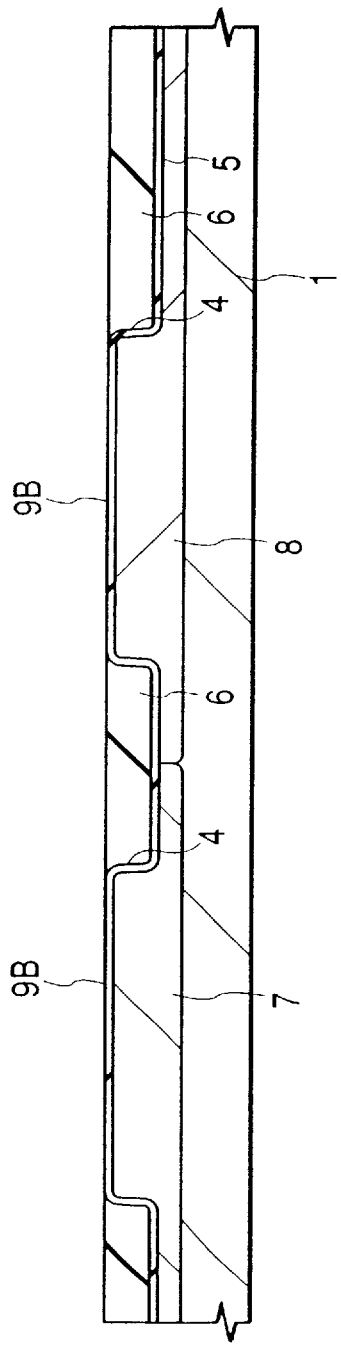
FIG. 24 is an equation for defining the thickness of an insulating film in terms of $SiO_2$.
FIG. 25 is a fragmentary cross-sectional view of a semiconductor substrate illustrating the manufacturing method of a CMOS-logic LSI according to Embodiment 3 of the present invention.

The effective film thickness (dr) of a single insulating film or composite insulating film in terms of $Sio_2$ ("effective film thickness in terms of $SiO_2$" will hereinafter called "effective film thickness", simply") is defined by the equation shown in FIG. 24, wherein a specific dielectric constant of the target insulating film is $\epsilon i$, its film thickness is di and the specific dielectric constant of silicon dioxide is $\epsilon s$.

The dielectric constants of silicon oxide ($SiO_2$) and silicon nitride ($Si_3N_4$) are 4 to 4.2 and 9, respectively. According to the calculation based on the supposition that the dielectric constant of silicon nitride is twice as much as that of silicon oxide, a silicon nitride film of 6 nm thick has a thickness of 3 nm in terms of $SiO_2$. In other words, a gate insulating film made of a silicon nitride film of 6 nm thick is equal in capacity to a gate insulating film made of a silicon oxide film of 3 nm thick. A gate insulating film made of a composite of a silicon oxide film of 2 nm thick and a silicon nitride film of 2 nm thick (effective film thickness: 1 nm) is equal in capacity to a gate insulating film made of a single silicon oxide film of 3 nm thick.

The defects of a gate insulating film made of a silicon nitride film (a single or composite insulating film having a silicon nitride film as a principal component) are repaired in the following manner: As illustrated in FIG. 25, first, a p-type well 7 and n-type well 8 are formed in a substrate 1 in a similar manner to Embodiment 1. An unnecessary insulating film is then removed from their surfaces by washing, followed by the deposition of a silicon nitride film by CVD to form a gate insulating film 9B. This silicon nitride film is preferably deposited by low-pressure CVD which gives less damage to the substrate 1 than plasma CVD. Alternatively, a silicon nitride film is formed by plasma nitriding treatment of the surface of the substrate 1.

The effective film thickness of the gate insulating film 9B (silicon nitride film) in terms of $SiO_2$ is adjusted to less than 5 nm, less than 4 nm and less than 3 nm when the gate lengths of a gate electrode to be formed over the gate insulating film 9B in the subsequent step are about 0.25 to 0.2 $\mu$m, 0.18 to 0.14 $\mu$m and 0.13 to 0.1 $\mu$m, respectively. In these cases, the actual film thickness of the gate insulating film 9B (silicon nitride film) are less than 10 nm, less than 8 nm and less than 6 nm, respectively.

Figure 26:
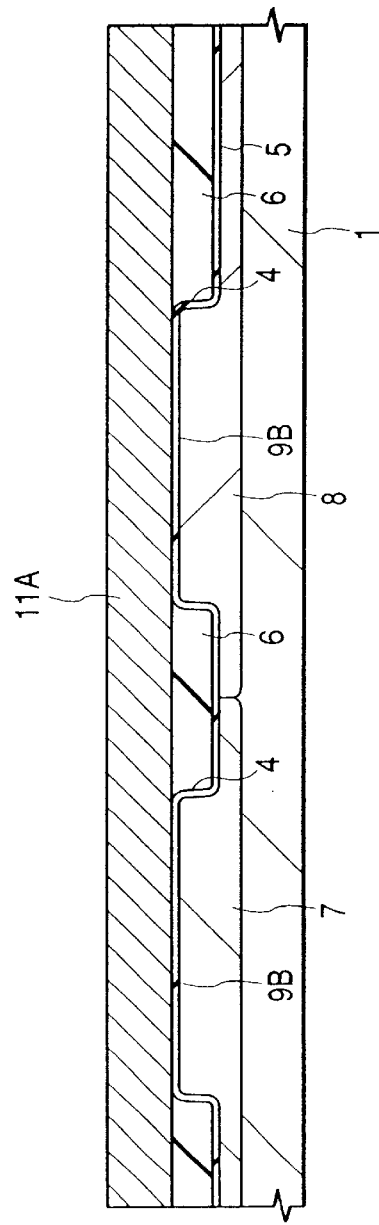
FIG. 26 is a fragmentary cross-sectional view of a semiconductor substrate illustrating the manufacturing method of a CMOS-logic LSI according to Embodiment 3 of the present invention.

As illustrated in FIG. 26, a W film 11A (or Mo film) of about 50 nm thick is formed over the gate insulating film 9B by sputtering or CVD.

In the gate insulating film 9B made of silicon nitride, defects mainly caused by a Si—N bond deficiency appear upon formation of the film. When the W film 11A is deposited directly on the gate insulating film 9B, a stress generated in the W film 11A upon film formation is applied to the gate insulating film 9B (silicon nitride film) lying rightly under the W film 11A and defects appear in the gate insulating film 9B in the vicinity of the interface between them. In the ultra-thin gate insulating film 9B having an effective film thickness less than 5 nm in terms of $SiO_2$, a deterioration in its withstand voltage or TDDB resistance and lowering in the reliability of the film occur owing to even slight existence of such defects in the film.

The defects of the gate insulating film 9B are therefore repaired by heat treating the wafer 1 in an oxidizing atmosphere, thereby feeding the gate insulating film 9B, which lies under the W film 11A, with oxygen through the W film 11A. Defect repairing in this case is carried out by introducing oxygen into the Si—N bond deficient portion existing in the silicon nitride film constituting the gate insulating film 9B to form an Si—O bond. In this heat treatment for repairing defects, only Si must be selectively oxidized without oxidizing W, a gate electrode material, so that, similar to Embodiment 1, heat treatment is carried out in a water vapor+hydrogen mixed gas atmosphere having a water vapor/hydrogen partial pressure ratio set at a ratio within a range sandwiched between the curve (a) and curve (d) of FIG. 13. The gate electrode material made of an Mo film is, on the other hand, heat treated in a water vapor+ hydrogen mixed gas atmosphere having a water vapor/ hydrogen partial pressure ratio set at a ratio within a range sandwiched between the curve (b) and curve (d). These water vapor+hydrogen mixed gases are formed using the above-described water vapor+hydrogen mixed gas generator of a catalytic system capable of precisely controlling the water vapor concentration of the gas.

The gate insulating film 9B made of a composite of a silicon nitride film and a silicon oxide film is formed, for example, by thermally oxidizing the surface of the substrate 1 (p-type well 7, n-type well 8) to form a silicon oxide film and then depositing thereover a silicon nitride film by CVD. In this case, defects are repaired by heat treatment with the above-described water vapor+hydrogen mixed gas, thereby feeding oxygen to each of the SiN-bond deficient portion in the silicon nitride film and the Si—O bond deficient portion in the silicon oxide film.

The defects of the gate insulating film 9B made of a composite of a silicon nitride film and a silicon oxide film may be repaired in a gas atmosphere obtained by adding nitrogen or ammonia to the water vapor+hydrogen mixed gas. In this case, the silicon oxide film which is a part of the gate insulating film 9B is converted into an oxynitride film, leading to a further improvement in the reliability and withstand voltage of the gate insulating film 9B.

Figure 27:
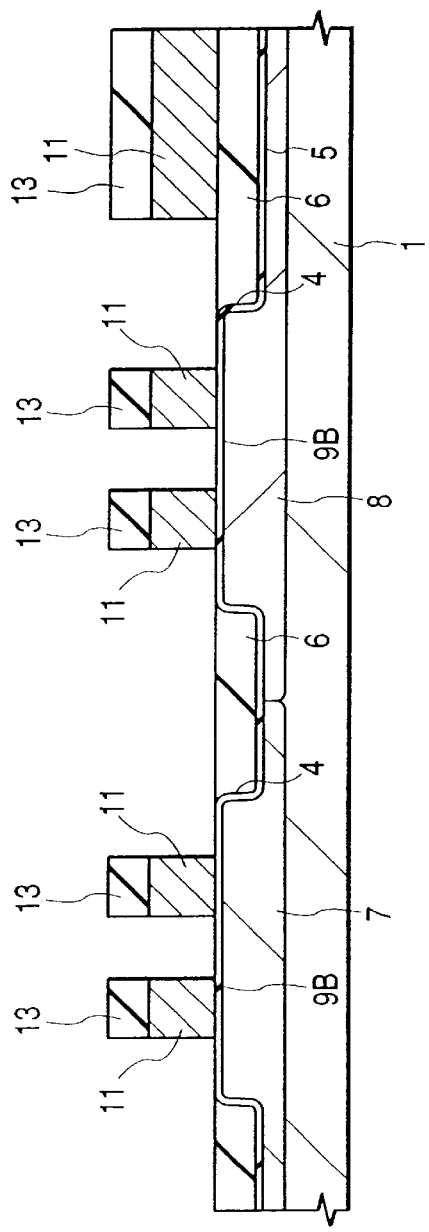
FIG. 27 is a fragmentary cross-sectional view of a semiconductor substrate illustrating the manufacturing method of a CMOS-logic LSI according to Embodiment 3 of the present invention.

As illustrated in FIG. 27, after deposition of a silicon nitride film 13 of about 50 nm to 100 nm thick over the W film 11A by CVD, the silicon nitride film 13 and W film 11A are patterned by dry etching with a photoresist film 14 as a mask, whereby a gate electrode 11 is formed.

Embodiment 4

In Embodiment 3, a gate insulating film is formed from a silicon nitride film having a dielectric constant about twice as much as that of a silicon oxide film or an insulating film having the silicon nitride film as a principal component. Use of an insulating material having a higher dielectric constant than the silicon nitride film makes it possible to form an insulating film, which has an effective film thickness less than 5 nm in terms of $Sio_2$, to be thicker than the silicon nitride film, thereby facilitating the formation of a fine MISFET.

Examples of the gate insulating film material having a higher dielectric constant than a silicon nitride film include oxides of a refractory metal such as tantalum oxide ($Ta_2O_5$) and titanium oxide ($TiO_2$). Since tantalum oxide has a dielectric constant as high as 20 to 25 and is suited for film formation by CVD, it has conventionally been used as a capacitor material of a DRAM (Dynamic Random Access Memory). It is well matched with the existing manufacturing method of a semiconductor. Titanium oxide having a still higher dielectric constant of 80 to 120 is also well matched with the existing manufacturing method of a semiconductor, because Ti is used in the semiconductor manufacturing method as a silicide material. In addition, the oxide of zirconium (Zr) or hafnium (Hf) ($ZrO_2$, $HfO_2$) has a high dielectric constant substantial similar to titanium oxide and is chemically stable so that it can be used as a material for an ultra-thin gate insulating material.

Figure 28:
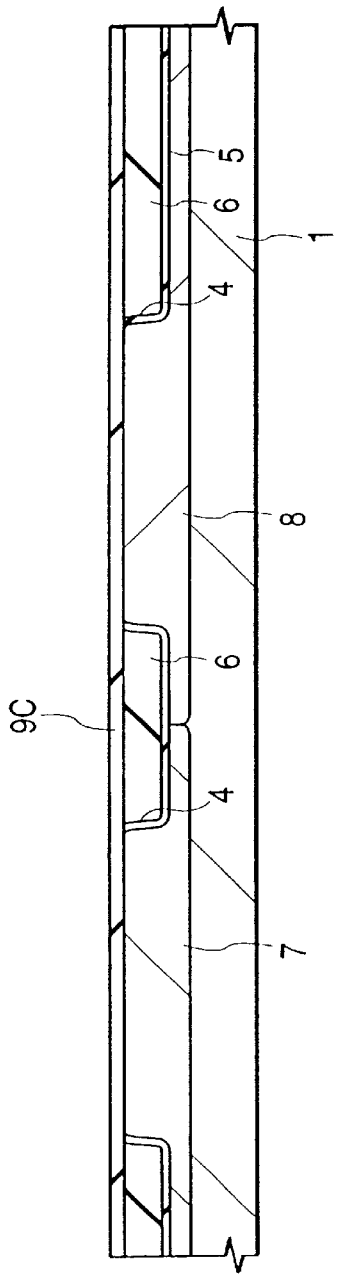
FIG. 28 is a fragmentary cross-sectional view of a semiconductor substrate illustrating a manufacturing method of CMOS-logic LSI according to Embodiment 4 of the present invention.

For example, a MISFET having a gate insulating film made of titanium oxide is formed, as illustrated in FIG. 28, by forming a p-type well 7 and n-type well 8 in a substrate 1 in a similar manner to Embodiment 1, washing their surfaces to remove an unnecessary insulating film, depositing a titanium oxide film over them by sputtering and thus forming a gate insulating film 9C. By adjusting the thickness of the titanium oxide film to about 40 to 60 nm, a gate insulating film 9C having an effective film thickness of 2 nm in terms of $SiO_2$ is available.

Figure 29:
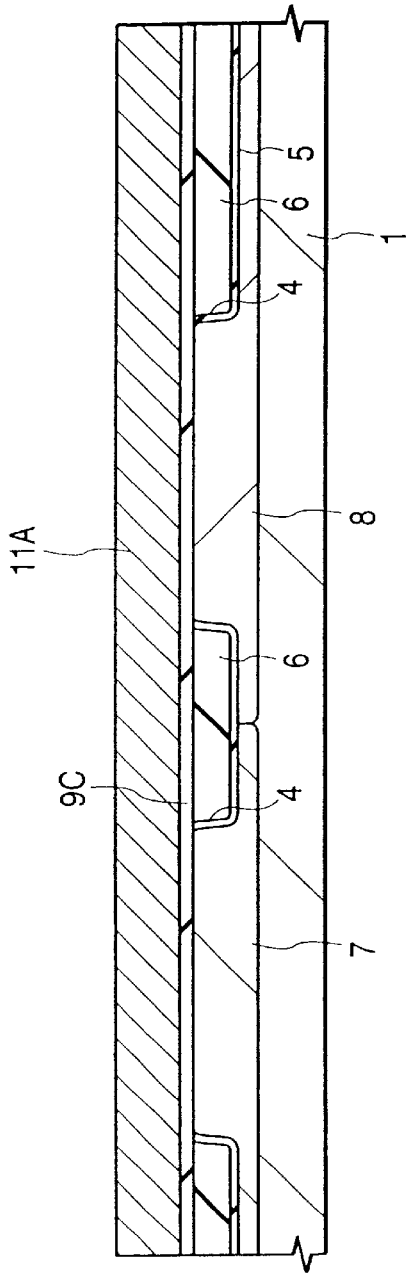
FIG. 29 is a fragmentary cross-sectional view of a semiconductor substrate illustrating the manufacturing method of a CMOS-logic LSI according to Embodiment 4 of the present invention.

Then, as illustrated in FIG. 29, a W film 11 (or Mo film) of about 50 nm thick is formed over the gate insulating film 9C by sputtering or CVD.

Crystalline metal oxides such as titanium oxide constituting the gate insulating film 9C contain, in the film just after the formation, many defects (mainly, oxygen deficiency existing in crystals or grain boundary) which will be a leak path of a current. In addition, when the W film 11A is deposited directly on the gate insulating film 9C, a stress generated in the W film 11A upon film formation is applied to the gate insulating film 9C lying thereunder and defects also appear in the gate insulating film 9C in the vicinity of the interface between them. It is therefore necessary to repair these defects in order to obtain a titanium oxide film having an insulating property sufficient for use as a gate insulating film.

The defects of the gate insulating film 9C made of an oxide of a refractory metal such as titanium oxide are repaired by heat treating the substrate 1 in an oxidizing atmosphere, thereby introducing oxygen into an oxygen deficient portion of the gate insulating film 9C through the W film 11A and improving and crystallizing the film.

The gate insulating film 9C formed using titanium oxide as an oxide of a refractory metal must be heat treated in an atmosphere which permits oxidation of Ti without substantial oxidation of W which is a gate electrode material deposited over the insulating film. This heat treatment must therefore be carried out in a water vapor+hydrogen mixed gas atmosphere having a water vapor/hydrogen partial pressure ratio set at a ratio within a range sandwiched between the curve (a) and curve (e) of FIG. 13. As can be seen from the drawing, the equilibrium vapor pressure curve of Ti in the water vapor+hydrogen mixed gas atmosphere is on the side of a slightly lower water vapor partial pressure than Si so that the substrate 1 is also oxidized by the heat treatment in the water vapor+hydrogen mixed gas atmosphere having a high water vapor concentration. As a result, a silicon oxide film is formed on the interface between the gate insulating film 9C and the substrate 1 lying thereunder, which increases the effective film thickness of the gate insulating film 9C in terms of $SiO_2$.

In order to suppress the growth of the silicon oxide film as much as possible, heat treatment is carried out in a water vapor+hydrogen mixed gas atmosphere having a remarkably decreased water vapor concentration. This makes it possible to retard the oxidizing rate of Si, whereby the defects of the gate insulating film 9C can be repaired while suppressing the oxidation of the substrate 1 to the minimum level. More specifically, the heat treatment is carried out at a temperature range of from 400° C. to 700° C. in a water vapor+hydrogen mixed gas atmosphere having a water vapor concentration set at several ppm to 100 ppm.

The redox equilibrium curve of the above-described Zr or Hf in a water vapor+hydrogen mixed gas atmosphere is, similar to that of Ti, on a lower water vapor side. The defects of the gate insulating film 9C, which has been formed by depositing a thin film of an oxide ($ZrO_2$, $HfO_2$) of a refractory metal over the substrate 1, are repaired in a similar manner to that employed for the gate insulating film 9C made of titanium oxide. In other words, heat treatment is carried out in a water vapor+hydrogen mixed gas atmosphere having a water vapor/hydrogen partial pressure ratio set at a ratio permitting selective oxidation of the metal (Zr, Hf) without oxidizing the gate electrode material (W).

For the formation of a MISFET having a gate insulating film made of tantalum oxide, a tantalum oxide film is deposited over the substrate 1 (p-type well 7, n-type well 8) by CVD to form a gate insulating film 9C. The gate insulating film 9C having an effective film thickness of 2 nm in terms of $SiO_2$ can be obtained by adjusting the thickness of the tantalum oxide film to about 10 to 12 nm.

The defects of the gate insulating film 9C made of tantalum oxide must be repaired by the heat treatment in an atmosphere which permits oxidation of Ta without substantial oxidation of W which is a gate electrode material deposited over the insulating film. In other words, the substrate 1 is heat treated in a water vapor+hydrogen mixed gas atmosphere having a water vapor/hydrogen partial pressure ratio set at a ratio within a range sandwiched between the curve (a) and curve (c) of FIG. 13. As can be seen from the drawing, however, the oxidizing rate of Ta is smaller than that of Si in the water vapor+hydrogen mixed gas atmosphere so that it is impossible to oxidize only Ta without substantial oxidation of Si. The oxidation of the substrate 1 occurs simultaneously with the defect repairing of the gate insulating film 9C made of tantalum oxide. As a result, a silicon oxide film is formed on the interface between the gate insulating film 9C and the substrate 1 lying thereunder, which increases the effective film thickness of the gate insulating film 9C in terms of $SiO_2$.

In this case, heat treatment, in a water vapor+hydrogen mixed gas atmosphere having a remarkably decreased water vapor concentration, by using the above-described water vapor+hydrogen mixed gas generator of a catalytic system makes it possible to retard the oxidizing rate of Ta and Si, whereby the defects of the gate insulating film 9C can be repaired while suppressing the oxidation of the substrate 1 to the minimum level. More specifically, the heat treatment is carried out at a temperature range of from 400° C. to 700° C. in a water vapor+hydrogen mixed gas atmosphere having a water vapor concentration set at about 1% to 50%.

Alternatively, the defects of the gate insulating film 9C made of an oxide of a high refractory metal such as titanium oxide, zirconium oxide, hafnium oxide or tantalum oxide can be repaired prior to the deposition of the gate electrode material (W film 11A) over the gate insulating film 9C. In this case, a sufficient amount of oxygen can be fed to the metal oxide forming the gate insulating film 9C so that the defects in the film can be repaired more completely. For the repairing of the defects of the gate insulating film 9C which have appeared by the deposition of the W film 11A, the above-described heat treatment must be conducted again after the deposition of the W film 11A.

The defects of the gate insulating film 9C made of the above-described oxide of a refractory metal may be repaired after formation of the gate electrode by patterning the W film or Mo film deposited thereover. Alternatively, defects may be repaired twice before and after the formation of the gate electrode.

The gate insulating film made of a metal oxide can also be formed using alumina ($Al_2O_3$) having a dielectric constant of 8 to 10. It can be formed using a metal oxide [for example, BST (barium strontium titanate)] which is a high dielectric substance containing an $ABO_3$ type average perovskite structure and is in a paraelectric phase at an operating temperature, or a substance containing as a principal component a binary oxide or multi-element oxide containing at least two metal oxides, or a composite film of such a metal oxide with a silicon oxide film or a silicon nitride film.

Embodiment 5

A gate insulating film 9C made of an oxide (such as titanium oxide, zirconium oxide or hafnium oxide) of a refractory metal having an equilibrium curve of redox reaction in a water vapor+hydrogen gas atmosphere on the side of a lower water vapor concentration than Si can be formed by the below-described manner.

As illustrated in FIG. 30, p-type well 7 and n-type well 8 are formed in the substrate 1 in a similar mariner to Embodiment 1, followed by washing their surfaces to remove therefrom an unnecessary insulating film. Then, a Ti film 31 is deposited over them by sputtering.

As illustrated in FIG. 31, the substrate 1 is heat treated in a water vapor+hydrogen mixed gas atmosphere having a water vapor/hydrogen partial pressure ratio set at a ratio (within a range sandwiched between the curve (d) and curve (e) of FIG. 13) permitting selective oxidation of Ti without substantial oxidation of Si. By this heat treatment, the Ti film 31 is oxidized into a titanium oxide film, whereby a gate insulating film 9C made of titanium oxide can be obtained.

For the formation of a gate insulating film 9C made of zirconium oxide (or hafnium oxide) in a similar manner, the substrate 1 is heat treated, after deposition of a Zr film (or Hf film ) over the substrate 1, in a water vapor+hydrogen gas atmosphere having a water vapor/hydrogen partial pressure ratio set at a ratio permitting selective oxidation of Zr (or Hf) without substantial oxidation of the substrate 1 (Si). By this heat treatment, the Zr film (or Hf film) is oxidized into a zirconium oxide film (or hafnium oxide film), whereby the gate insulating film 9C made of the zirconium oxide film (or hafnium oxide film) can be obtained.

Figure 32:
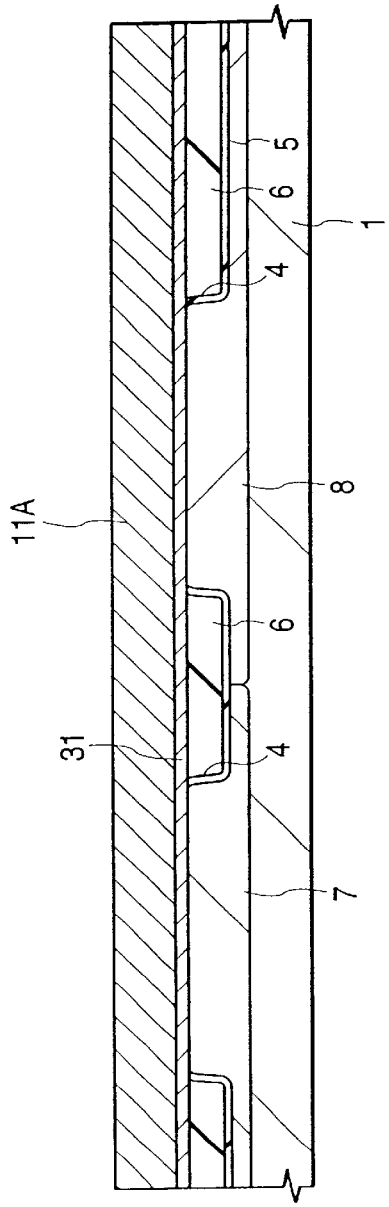
FIG. 32 is a fragmentary cross-sectional view of a semiconductor substrate illustrating the manufacturing method of a CMOS-logic LSI according to Embodiment 5 of the present invention.
Figure 33:
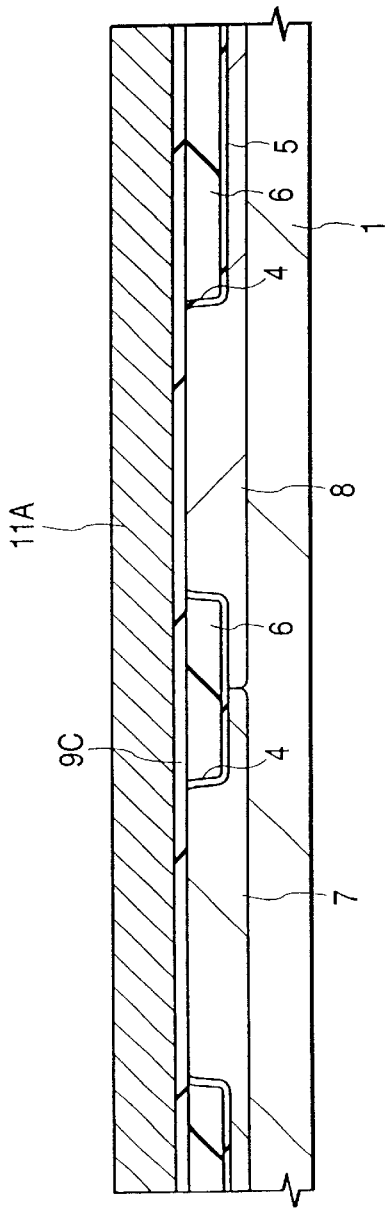
FIG. 33 is a fragmentary cross-sectional view of a semiconductor substrate illustrating the manufacturing method of a CMOS-logic LSI according to Embodiment 5 of the present invention.

The heat treatment for converting the refractory metal film, which has been deposited over the substrate 1, into the corresponding oxide may be carried out after deposition of a gate electrode material such as W film over the refractory metal film. In this case, as illustrated in FIG 32, the Ti film 31 is deposited over the substrate 1 (p-type well 7 and n-type well 8) by sputtering, followed by the formation of the W film 11A (or Mo film) of about 50 nm thick over the Ti film 31 by sputtering or CVD.

The substrate 1 is then heat treated in a water vapor+ hydrogen mixed gas atmosphere having a water vapor/ hydrogen partial pressure ratio set at a ratio (within a range sandwiched between the curve (d) and curve (e) of FIG. 13) permitting selective oxidation of Ti without substantial oxidation of Si. By this heat treatment, the oxidizing gas (OH group) derived from the water vapor in the water vapor+hydrogen mixed gas penetrates into the Ti film 31 through the W film 11A (or Mo film) and converts the Ti film 31 into a titanium oxide film, whereby the gate insulating film 9C made of the titanium oxide film is formed rightly under the W film 11A (or Mo film) used as a gate electrode material. Even by the heat treatment in a water vapor+hydrogen mixed gas atmosphere having a water vapor/hydrogen partial pressure ratio set at the above-described ratio, the W film 11A (or Mo film) is not oxidized at all so that the gate electrode is free from an increase in its resistance.

A gate insulating film 9C made of a zirconium oxide film or hafnium oxide film can be formed by oxidizing a zirconium film or hafnium film in the above-described manner.

Embodiment 6

A gate insulating film 9A having an effective film thickness less than 5 nm in terms of $SiO_2$ and has, as a principal component, silicon oxide can also be formed by the following manner.

Figure 34:
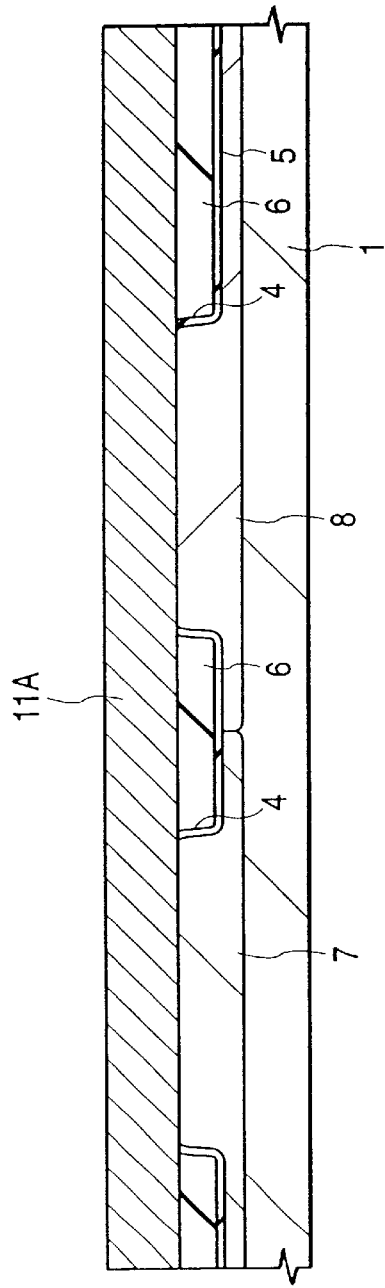
FIG. 34 is a fragmentary cross-sectional view of a semiconductor substrate illustrating a manufacturing method of a CMOS-logic LSI according to Embodiment 6 of the present invention.
Figure 35:
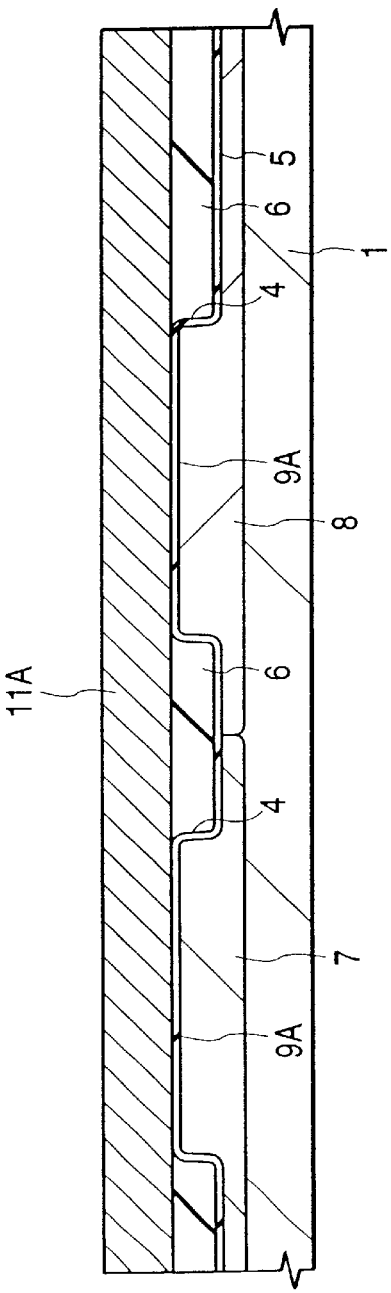
FIG. 35 is a fragmentary cross-sectional view of a semiconductor substrate illustrating the manufacturing method of a CMOS-logic LSI according to Embodiment 6 of the present invention.

As illustrated in FIG. 34, p-type well 7 and n-type well 8 are formed in the substrate 1 in a similar manner to Embodiment 1, followed by washing their surfaces to remove therefrom an unnecessary insulating film. Then, a W film 11A (or Mo film) of about 50 nm thick is formed thereover by sputtering or CVD.

The substrate 1 having the W film 11A formed thereover is then heat treated. This heat treatment is conducted in a water vapor+hydrogen mixed gas atmosphere having a water vapor/hydrogen partial pressure ratio set at a ratio within a range sandwiched between the curve (a) and curve (d) of FIG. 13, that is, a water vapor+hydrogen mixed gas atmosphere permitting selective oxidation of Si without substantial oxidation of W. This water vapor+hydrogen mixed gas may be formed using the above-described water vapor+hydrogen mixed gas generator of a catalytic system capable of precisely controlling the water vapor concentration of the gas.

By this heat treatment, the oxidizing gas (OH group) derived from the water vapor in the water vapor+hydrogen mixed gas penetrates into the substrate 1 through the W film 11A, whereby the surface of the substrate 1 is oxidized. As a result, the gate insulating film 9A made of a markedly thin silicon oxide film is formed on the interface between the W film 11A and the substrate 1. This method makes it possible to form a gate insulating film made of a silicon oxide film as considerably thin as less than 1 nm can even be formed.

Heat treatment at temperatures exceeding 550 to 600° C. upon oxidation of the surface of the substrate 1 induces reaction between the W film 11A and substrate 1, thereby forming a silicide compound on the interface between them. It is therefore necessary to carry out heat treatment in a temperature region low enough not to cause the silicide reaction. Similarly, when a metal film for the gate electrode is Mo, a silicide reaction occurs at a heat treating temperature exceeding 500° C. so that heat treatment must be conducted at a temperature range not greater than 500° C.

Figure 36:
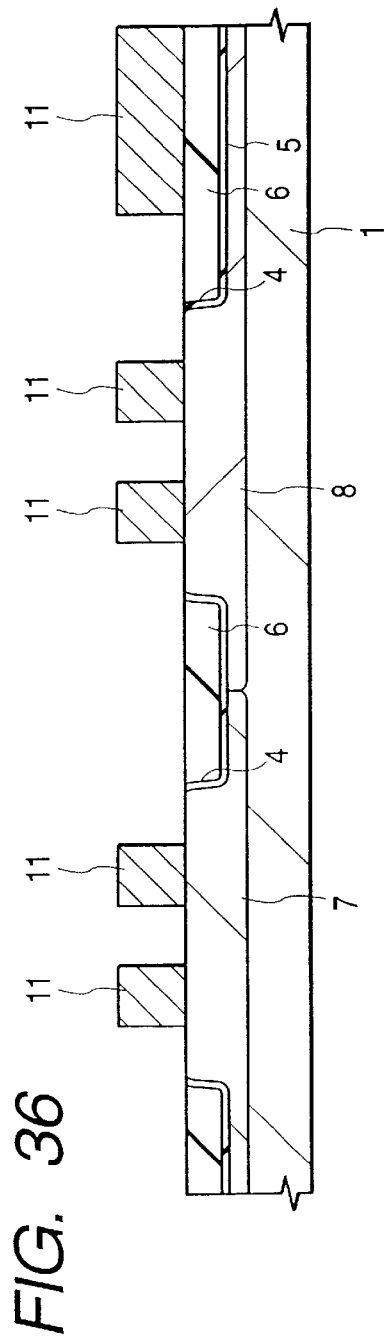
FIG. 36 is a fragmentary cross-sectional view of a semiconductor substrate illustrating the manufacturing method of a CMOS-logic LSI according to Embodiment 6 of the present invention.

Heat treatment for the formation of a gate insulating film 9D made of silicon oxide on the interface between the W film 11A and substrate 1 may be carried out after formation of the gate electrode. In this case, as illustrated in FIG. 36, after formation of a W film 11A of about 50 nm thick over the substrate 1 (p-type well 7 and n-type well 8) by sputtering or CVD, the W film 11A is dry etched with a photoresist film (not illustrated) as a mask, whereby the gate electrode 11 is formed. This gate electrode 11 may be formed by dry etching of an Mo film.

The substrate 1 having the gate electrode 11 formed thereover is then heat treated. This heat treatment is carried out in a water vapor+hydrogen mixed gas atmosphere having a water vapor/hydrogen partial pressure ratio set at a ratio within a range sandwiched between the curve (a) and curve (d) of FIG. 13, that is, in a water vapor+hydrogen mixed gas atmosphere having a water vapor concentration set to permit selective oxidation of Si without oxidation of W.

Figure 37:
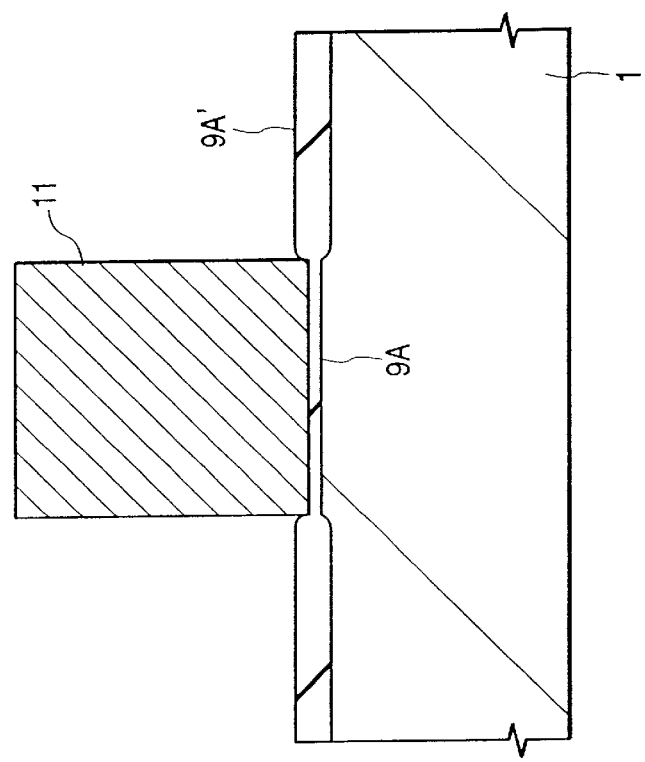
FIG. 37 is a fragmentary enlarged cross-sectional view of a semiconductor substrate illustrating the manufacturing method of a CMOS-logic LSI according to Embodiment 6 of the present invention.

By the above-described heat treatment, the surface of the substrate 1 is oxidized, whereby a gate insulating film 9A' made of silicon oxide is formed as illustrated in FIG. 37. At this time, an oxidizing gas (an OH group) is also fed to the substrate 1 rightly under the gate electrode 11 through the W film (11A) constituting the gate electrode 11 so that the substrate 1 in this region is oxidized. The oxidized amount is not so large in the substrate 1 rightly under the gate electrode 11 compared with that in the substrate 1 in the other region so that a gate insulating film 9A made of a markedly thin silicon oxide film is formed on the interface between the W film 11A and the substrate 1. By this method, a gate insulating film made of a silicon oxide film as thin as not greater than 1 nm can even be formed.

In this case, heat treatment must be carried out in a temperature region not permitting the formation of a silicide compound on the interface between the W film (11A) constituting the gate electrode 11 and the substrate 1.

Embodiment 7

In this embodiment, the process of the present invention is applied to a technique for manufacturing a MISFET by forming a gate electrode by the Damascene method.

Figure 38:
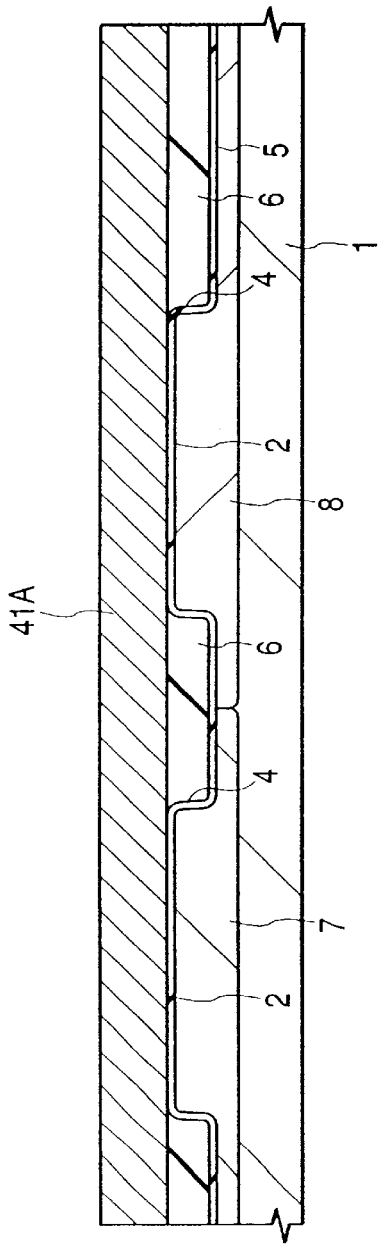
FIG. 38 is a fragmentary cross-sectional view of a semiconductor substrate illustrating a manufacturing method of a CMOS-logic LSI according to Embodiment 7 of the present invention.

As illustrated in FIG. 38, a p-type well 7 and an n-type well 8 are formed in the substrate 1 in a similar manner to Embodiment 1, followed by deposition of a polycrystalline silicon film 41A of about 50 nm thick by CVD over the silicon oxide film 2, which has remained on the surface of each of the p-type well 7 and n-type well 8.

Figure 39:
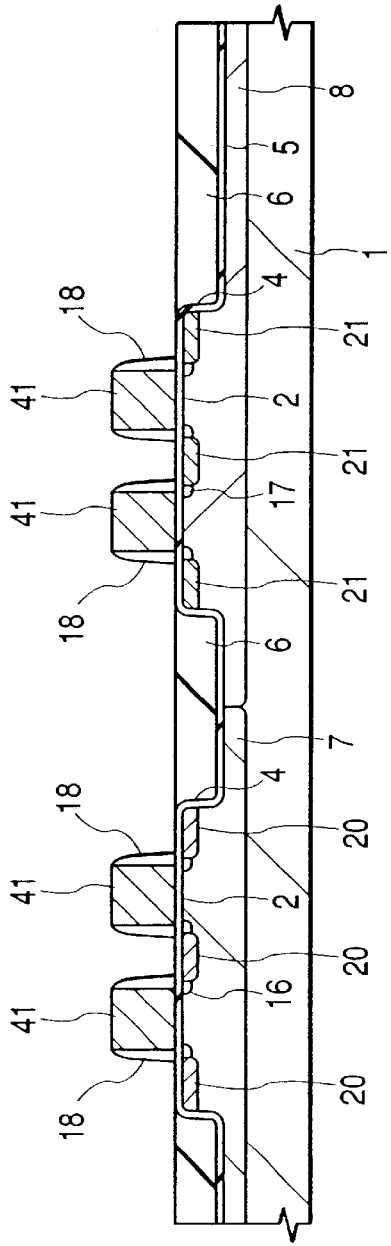
FIG. 39 is a fragmentary cross-sectional view of a semiconductor substrate illustrating the manufacturing method of a CMOS-logic LSI according to Embodiment 7 of the present invention.

As illustrated in FIG. 39, after patterning of the polycrystalline silicon film 41A by dry etching with a photoresist film (not illustrated) as a mask, thereby forming a gate electrode 41, side wall spacers 18 are formed on the side walls of the gate electrode 11 in a similar manner to Embodiment 1 and then, $n^+$ type semiconductor regions 20 (source, drain) and $p^+$ type semiconductor regions 21 (source, drain) are formed in the p-type wells 7 and n-type wells 8, respectively. A material for the gate electrode 41 is not limited to polycrystalline silicon and, for example, silicon nitride can be employed.

As illustrated in FIG. 40, after deposition of a silicon oxide film 42 over the substrate 1 by CVD, the silicon oxide film 42 is flattened by chemical mechanical polishing, whereby the height of the silicon oxide film 42 is made equal to that of the gate electrode 11.

As illustrated in FIG. 41, the surface of the substrate 1 (p-type well 7, n-type well 8) below the gate electrode 11 is exposed by removing the gate electrode 11 by dry etching with the silicon oxide film 42 as a mask.

Figure 42:
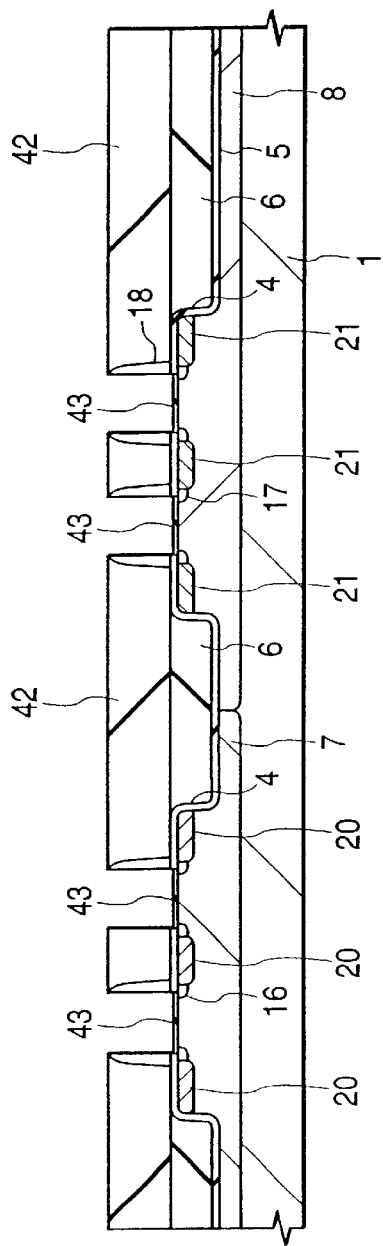
FIG. 42 is a fragmentary cross-sectional view of a semiconductor substrate illustrating the manufacturing method of a CMOS-logic LSI according to Embodiment 7 of the present invention.

As illustrated in FIG. 42, over the surface of the substrate 1 (p-type well 7, n-type well 8) exposed by removal of the gate electrode 11, a remarkably thin silicon oxide film 43 as thin as not greater than 1 nm is formed. This silicon oxide film 43 is formed by heat treating the substrate 1 in a water vapor+hydrogen mixed gas atmosphere having a water vapor/hydrogen partial pressure ratio set at a ratio permitting oxidation of Si. At this time, the water vapor concentration is adjusted to, for example, about 1 to 30% and heat treating temperature is set at, for example, about 700 to 800° C.

Figure 43:
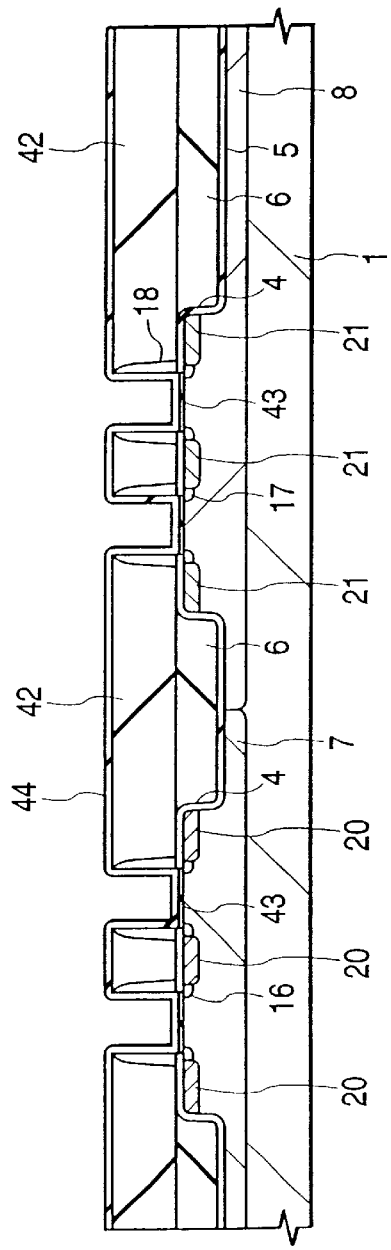
FIG. 43 is a fragmentary cross-sectional view of a semiconductor substrate illustrating the manufacturing method of a CMOS-logic LSI according to Embodiment 7 of the present invention.

As illustrated in FIG. 43, a titanium oxide film 44 as markedly thin as not greater than 1 nm in terms of $SiO_2$ is deposited over the silicon oxide films 42,43 by sputtering. Any one of the above-described metal oxides for a gate insulating film having a high dielectric constant, for example, zirconium oxide, hafnium oxide and tantalum oxide can be deposited as an insulating film.

Figure 44:
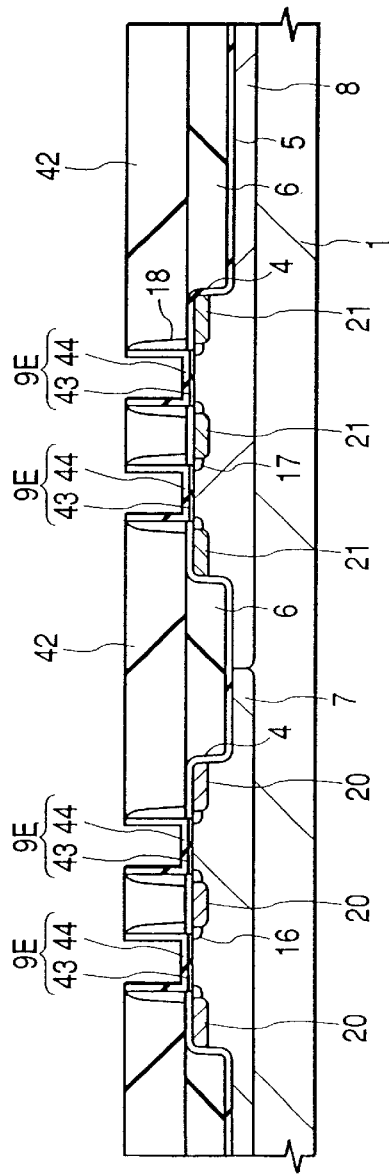
FIG. 44 is a fragmentary cross-sectional view of a semiconductor substrate illustrating the manufacturing method of a CMOS-logic LSI according to Embodiment 7 of the present invention.

As illustrated in FIG. 44, the titanium oxide film 44 over the silicon oxide film 42 is removed by chemical mechanical polishing, whereby a gate insulating film 9E made of a composite of the silicon oxide film 43 and the titanium oxide film 44 thereover is formed on the surface of the substrate 1 (p-type well 7, n-type well 8) in a region where a gate electrode will be formed in the subsequent step. At this time, a part of the gate insulating film 9E (titanium oxide film 44) is also formed on the side walls of the side wall spacers 48.

The substrate 1 is then heat treated to repair the defects of the silicon oxide film 43 and titanium oxide film 44 constituting the gate insulating film 9E. This heat treatment of the substrate 1 is carried out in a water vapor+hydrogen mixed gas atmosphere having a water vapor/hydrogen partial pressure ratio set at a ratio permitting oxidation of both Si and Ti. The heat treatment is conducted, for example, at a water vapor concentration of about 1 to 30% and heat treating temperature of about 600 to 800° C.

Figure 45:
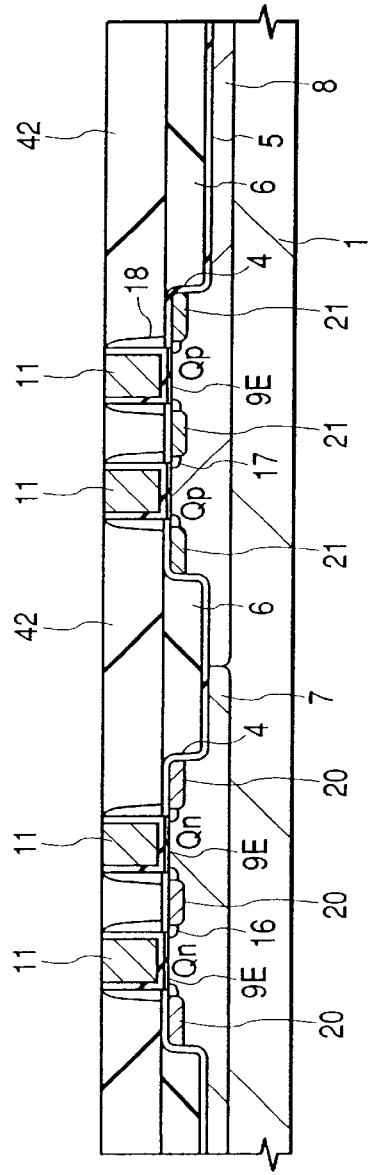
FIG. 45 is a fragmentary cross-sectional view of a semiconductor substrate illustrating the manufacturing method of a CMOS-logic LSI according to Embodiment 7 of the present invention.

As illustrated in FIG. 45, after formation of a W film over the silicon oxide film 42 and gate insulating film 9E by sputtering or CVD, the W film over the silicon oxide film 42 is removed by chemical mechanical polishing, whereby a gate electrode 11 is formed. The gate electrode 11 may be made of Mo, Cu or Al. By the steps so far described, an n-channel type MISFETQn and a p-channel type MISFETQp are formed in the p-type well 7 and n-type well 8, respectively.

When the gate electrode 11 is formed by the above-described Damascene method, a part of the gate insulating film 9E is also formed in the gate electrode 11, which brings about an improvement in the withstand voltage of the gate insulating film 9E below the side walls of the gate electrode 11.

The following are patent applications, under application, filed by various groups including the present inventors concerning the invention relating to a manufacturing method of a semiconductor integrated circuit making use of a catalytic reaction: Japanese Patent Application Laid-Open No. HEI 9(1997)-172011, PCT International Application Laid-Open WO97/28085, PCT Application PCT/JP98/00892, U.S. patent application Ser. Nos. 09/086,568, 09/089,398, and 09/314,956.

The invention made by the present inventors was specifically described based on its embodiments. It should however be born in mind that the present invention is not limited to or by these embodiments and can be modified within a range not departing from the scope of the present invention.

Advantages available from the typical inventions, among the inventions disclosed by the present application, will next be described.

The present invention makes it possible to improve the reliability and production yield of a MISFET having a metal gate electrode formed over a ultra-thin gate insulating film.

The present invention makes it possible to improve the reliability and production yield of a MISFET having a metal gate electrode formed over a gate insulating film containing a metal oxide having a higher dielectric constant than silicon oxide.

According to the present invention, a high-quality gate insulating film having an effective film thickness less than 5 nm in terms of $SiO_2$ can be formed in a high yield, which makes it possible to promote high integration of a CMOS-LSI.

What is claimed is:

1. A process for manufacturing a semiconductor integrated circuit device, which comprises steps of:

(a) forming, over the silicon surface on the first main surface of a wafer, a first film containing, as a principal component, a first refractory metal which has a redox equilibrium curve in a water vapor and hydrogen containing gas atmosphere on the lower water vapor side than that of silicon;

(b) heat treating the first main surface, which has the first film formed thereover, in a water vapor and hydrogen containing gas atmosphere having a water vapor hydrogen partial pressure ratio set at a ratio permitting oxidation of the first refractory metal without substantial oxidation of the silicon surface, thereby converting the first refractory metal without substantial oxidation of the silicon surface, thereby converting the first refractory metal to the oxide thereof to form a gate insulating film on the first main surface; and (c) prior to or after step (b), forming a gate electrode by patterning a second refractory metal which has a redox equilibrium curve in a water vapor and hydrogen containing gas atmosphere on the higher water vapor side than that of silicon.

2. A process according to claim 1, wherein the first refractory metal is titanium, zirconium or hafnium.

3. A process according to claim 2, wherein the water vapor and hydrogen containing gas atmosphere in the step (b) is formed by synthesizing water vapor in the presence of a catalyst.

4. A process according to claim 3, wherein the second refractory metal is tungsten or molybdenum.

5. A process according to claim 1, wherein the water vapor and hydrogen containing gas atmosphere in the step (b) is formed by synthesizing water vapor in the presence of a catalyst.

6. A process according to claim 1, wherein the second refractory metal is tungsten or molybdenum.

7. A process according to claim 2, wherein the second refractory metal is tungsten or molybdenum.

* * * * *